United States Patent
Murayama et al.

(10) Patent No.: US 9,722,198 B2
(45) Date of Patent: Aug. 1, 2017

(54) NANOPARTICLE MATERIAL AND LIGHT-EMITTING DEVICE

(71) Applicant: Murata Manufacturing Co., Ltd., Nagaokakyo-shi, Kyoto-fu (JP)

(72) Inventors: Koji Murayama, Nagaokakyo (JP); Haruya Miyata, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/099,796

(22) Filed: Apr. 15, 2016

(65) Prior Publication Data

US 2016/0233449 A1    Aug. 11, 2016

Related U.S. Application Data

(63) Continuation of application No. PCT/JP2014/077586, filed on Oct. 16, 2014.

(30) Foreign Application Priority Data

Oct. 17, 2013 (JP) ................. 2013-216635

(51) Int. Cl.
*H01L 51/52* (2006.01)
*H01L 51/50* (2006.01)
(Continued)

(52) U.S. Cl.
CPC .......... *H01L 51/502* (2013.01); *C09K 11/025* (2013.01); *C09K 11/565* (2013.01);
(Continued)

(58) Field of Classification Search
CPC .. H01L 51/502; H01L 51/5004; H01L 51/504
See application file for complete search history.

(56) References Cited

U.S. PATENT DOCUMENTS 6,751,243 B2    6/2004  Mukai
7,205,048 B2 *  4/2007  Naasani ................. B82Y 15/00
                                         252/301.4 R
(Continued)

FOREIGN PATENT DOCUMENTS

CN    102576746 A    7/2012
JP    2002184970 A    6/2002
(Continued)

OTHER PUBLICATIONS

International Search Report for PCT/JP2014/077586, date of mailing Jan. 20, 2015.
(Continued)

*Primary Examiner* — Michele Fan
(74) *Attorney, Agent, or Firm* — Arent Fox LLP

(57) ABSTRACT

A light-emitting device having a first light-emitting layer with a first quantum dot having a first core part and a first shell part. The first shell part has a surface coated with a surfactant, and the first shell part has a thickness of 3 to 5 ML based on the constituent molecule of the first shell part. The light-emitting device also can have second light-emitting layer with a second quantum dot having a second core part and a second shell part. The second shell part has a surface coated with two types of hole-transporting and electron-transporting surfactants, and the second shell part has a thickness of less than 3 ML based on the constituent molecule of the second shell part.

4 Claims, 18 Drawing Sheets

(51) Int. Cl.
*C09K 11/02* (2006.01)
*C09K 11/56* (2006.01)
*C09K 11/88* (2006.01)
*B82Y 20/00* (2011.01)
*H01L 51/00* (2006.01)

(52) U.S. Cl.
CPC ......... *C09K 11/883* (2013.01); *H01L 51/504* (2013.01); *H01L 51/5004* (2013.01); *B82Y 20/00* (2013.01); *H01L 51/001* (2013.01); *H01L 51/0003* (2013.01); *H01L 51/0035* (2013.01); *H01L 51/0037* (2013.01); *H01L 51/0043* (2013.01); *H01L 51/0081* (2013.01); *H01L 51/5056* (2013.01); *H01L 51/5072* (2013.01); *H01L 51/5088* (2013.01); *H01L 2251/552* (2013.01); *H01L 2251/558* (2013.01)

(56) References Cited

U.S. PATENT DOCUMENTS

| | | | | |
|---|---|---|---|---|
| 7,943,396 | B2* | 5/2011 | Weiss | B82Y 15/00 436/524 |
| 8,361,823 | B2 | 1/2013 | Kahen | |
| 8,742,399 | B2 | 6/2014 | Murayama | |
| 2001/0023078 | A1* | 9/2001 | Bawendi | B82Y 15/00 436/524 |
| 2002/0075924 | A1 | 6/2002 | Mukai | |
| 2003/0042850 | A1* | 3/2003 | Bertram | B82Y 10/00 313/504 |
| 2004/0126072 | A1* | 7/2004 | Hoon Lee | B82Y 10/00 385/122 |
| 2006/0068154 | A1 | 3/2006 | Parce et al. | |
| 2007/0034833 | A1 | 2/2007 | Parce et al. | |
| 2007/0162263 | A1 | 7/2007 | Forrest | |
| 2008/0020235 | A1 | 1/2008 | Parce et al. | |
| 2008/0107911 | A1* | 5/2008 | Liu | B32B 15/04 428/457 |
| 2008/0206565 | A1 | 8/2008 | Takahashi et al. | |
| 2008/0278063 | A1* | 11/2008 | Cok | B82Y 20/00 313/500 |
| 2009/0001349 | A1* | 1/2009 | Kahen | H05B 33/145 257/9 |
| 2009/0121190 | A1 | 5/2009 | Parce et al. | |
| 2010/0140551 | A1 | 6/2010 | Parce et al. | |
| 2012/0068118 | A1 | 3/2012 | Parce et al. | |
| 2012/0174969 | A1 | 7/2012 | Murayama | |
| 2012/0175593 | A1* | 7/2012 | Murayama | H01L 31/03521 257/13 |
| 2014/0022779 | A1* | 1/2014 | Su | H01L 33/504 362/231 |

FOREIGN PATENT DOCUMENTS

| | | | |
|---|---|---|---|
| JP | 2005502176 | A | 1/2005 |
| JP | 2006185985 | A | 7/2006 |
| JP | 2008214363 | A | 9/2008 |
| JP | 2009087754 | A | 4/2009 |
| JP | 2009520358 | A | 5/2009 |
| JP | 2009544805 | A | 12/2009 |
| JP | 2010532409 | A | 10/2010 |
| JP | 2011073726 | A | 4/2011 |
| JP | 2011076726 | A | 4/2011 |
| JP | 2011252117 | A | 12/2011 |
| JP | 2011252117 | A * | 12/2011 |
| JP | 2013157180 | A | 8/2013 |
| WO | WO 2008013780 | A2 * | 1/2008 ............. B82Y 20/00 |
| WO | WO 2011037041 | A1 | 3/2011 |
| WO | WO 2011037042 | A1 | 3/2011 |
| WO | WO 2012128173 | A1 | 9/2012 |
| WO | WO 2013157563 | A1 | 10/2013 |

OTHER PUBLICATIONS

Written Opinion of the International Searching Authority issued for PCT/JP2014/077586, date of mailing Jan. 20, 2015.

* cited by examiner

FIG. 23 - PRIOR ART
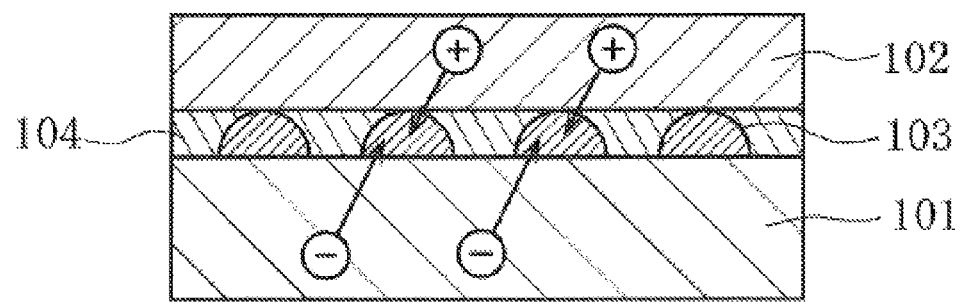
FIG. 24 - PRIOR ART
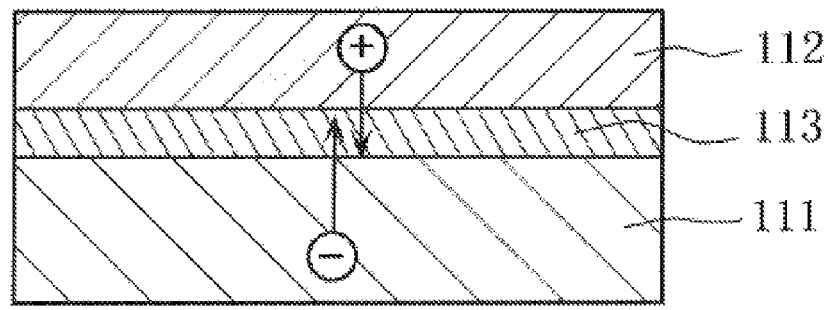

FIG. 25 – PRIOR ART
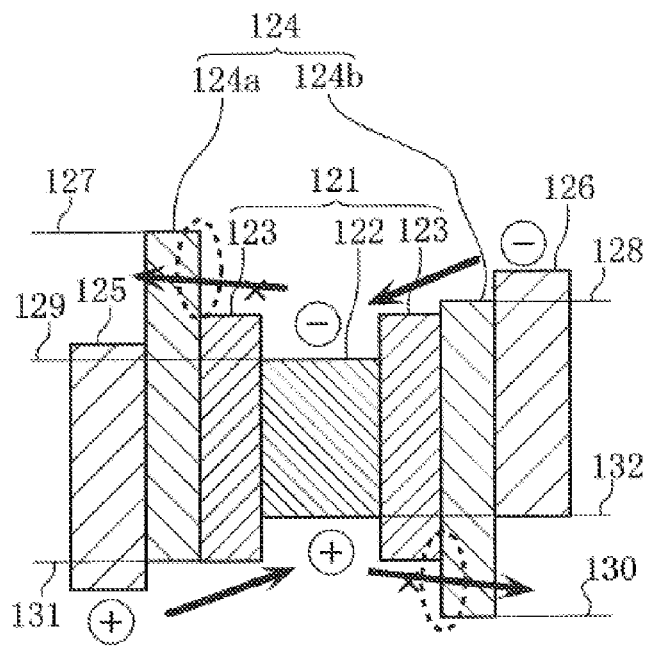
FIG. 26 – PRIOR ART
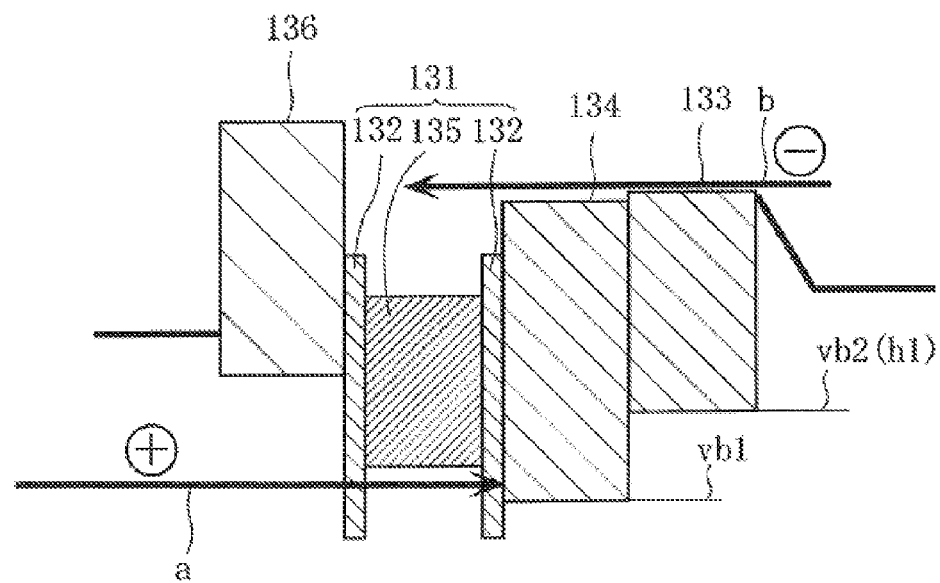

NANOPARTICLE MATERIAL AND LIGHT-EMITTING DEVICE

CROSS REFERENCE TO RELATED APPLICATIONS

The present application is a continuation of International application No. PCT/JP2014/077586, filed Oct. 16, 2014, which claims priority to Japanese Patent Application No. 2013-216635, filed Oct. 17, 2013, the entire contents of each of which are incorporated herein by reference.

FIELD OF THE INVENTION

The present invention relates to a nanoparticle material and a light-emitting device, more specifically, to a nanoparticle material that has a core-shell structure, and a light-emitting device such as an EL element (EL: Electro Luminescence) with a light-emitting layer formed with the use of the nanoparticle material.

BACKGROUND OF THE INVENTION

Quantum dots that are nanoparticles of 10 nm or less in particle size have excellent performance of confining carriers (electrons, holes), and can thus easily produce excitons by recombination of electrons and holes. For this reason, luminescence from free excitons can be expected, and it is possible to realize luminescence which has a high luminescent efficiency and a sharp emission spectrum.

In addition, the quantum dots are able to be controlled in a wide range of wavelengths by using the quantum size effect, and thus attracting attention for applications to light-emitting devices such as EL elements, light emitting diodes (LED), and semiconductor lasers.

It is considered important for this type of light-emitting device to confine and recombine carriers in the quantum dots (nanoparticles) with high efficiency, thereby increasing the luminescent efficiency. Further, a self-assembly (self-organization) method of preparing quantum dots by a dry process is known as a method for preparing the quantum dots.

The self-assembly method is a method of causing gas-phase epitaxial growth of a semiconductor layer under such a specific condition that provides lattice mismatch, and causing self-formation of three-dimensional quantum dots with the use of the strain thereof, and for example, when strain is produced from a difference in lattice constant between an n-type semiconductor substrate and a p-type semiconductor layer and epitaxial growth cannot be caused, a quantum dot is formed at the site with the strain produced.

However, in the self-assembly method, quantum dots are discretely distributed on the n-type semiconductor substrate, and gaps are thus produced between the adjacent quantum dots. For this reason, there is a possibility that holes transported from the p-type semiconductor layer will be transported toward the n-type semiconductor substrate without being injected into the quantum dots, or electrons transported from the n-type semiconductor substrate will be transported to the p-type semiconductor substrate without being injected into the quantum dots, and there is a possibility of causing a decrease in luminescent efficiency.

Moreover, in the self-assembly method mentioned above, there is a possibility that carriers that are not injected into the quantum dots will recombine to produce luminescence outside the quantum dots. Then, when carriers recombine to produce luminescence outside the quantum dots in such a manner, there is a possibility of producing more than one intensity peak and causing a decrease in purity of luminescent color. In addition, even when carriers that are not injected into the quantum dots recombine outside the quantum dots, the recombination does not produce luminescence and may result in non-luminescent recombination centers, and in such cases, electrical energy is released as thermal energy without being converted to light energy, and there is thus a possibility of causing a further decrease in luminescent efficiency.

Therefore, Patent Document 1 proposes a semiconductor device including a substrate with a main surface composed of a first semiconductor, a plurality of quantum dots discretely distributed on the main surface, a coating layer composed of a second semiconductor formed on the surface with the quantum dots distributed, and a barrier layer formed from a third semiconductor or an insulating material that is disposed on at least a part of the region without the quantum dots disposed in the plane with the quantum dots distributed and that has a larger bandgap than the bandgaps of the first and second semiconductors.

That is, in Patent Document 1, as illustrated in FIG. 23, n-type GaAs (first semiconductor) is used to form a substrate 101, and p-type GaAs (second semiconductor) is used to form a coating layer 102. In addition, quantum dots 103 composed of InGaAs are discretely distributed on the substrate 101 with the use of a self-assembly method, AlAs (third semiconductor) that has higher bandgap energy than GaAs is further epitaxially grown on the substrate 101 with the use of a molecular beam epitaxy method, and thereafter the AlAs is oxidized to form an insulating barrier layer 104.

In such a manner, in Patent Document 1, the gaps between the quantum dots 103 are filled with the insulating barrier layer 104 to thereby make carriers easy to inject into the quantum dots 103, and promote the recombination of electrons and holes in the quantum dots 103, thereby making an improvement in luminescent efficiency.

On the other hand, Patent Document 2 and Patent Document 3 are known as techniques of preparing colloidal quantum dots by a wet process.

Patent Document 2 proposes a light-emitting device including a light-emitting layer composed of quantum dots and emitting light by recombination of electrons and holes, an n-type inorganic semiconductor layer that transports the electrons to the light-emitting layer, a p-type inorganic semiconductor layer that transports the holes to the light-emitting layer, a first electrode for injecting the electrons into the n-type inorganic semiconductor layer, and a second electrode for injecting the holes into the p-type inorganic semiconductor layer.

In Patent Document 2, as illustrated in FIG. 24, an n-type semiconductor layer 111 and a p-type semiconductor layer 112 are formed from inorganic materials that have a band structure with favorable carrier transport properties, and a quantum dot layer 113 is interposed between the n-type semiconductor layer 111 and the p-type semiconductor layer 112.

Then, electrons transported from the n-type semiconductor layer 111 and holes transported from the p-type semiconductor layer 112 are, due to the tunnel effect, injected into the quantum dot layer 113 through potential barriers between the quantum dot layer 113 and the carrier transport layers (the n-type semiconductor layer 111 and the p-type semiconductor layer 112), thereby improving the efficiency of injecting carriers into the quantum dot layer 113.

In addition, Patent Document 3 proposes a nanoparticle luminescent material composed of a core part composed of a nanoparticle and a shell part composed of at least two types of ligands localized on the surface of the core part, and at least one of the ligands is a hole transporting ligand, whereas at least one thereof is an electron transporting ligand.

In Patent Document 3, with the use of a surfactant with a hole transporting ligand and an electron transporting ligand, the energy levels of each ligand are designed for such a combination that produces a carrier block effect so that carriers are confined in the nanoparticle.

FIG. 25 is a band structure diagram illustrating the energy band in Patent Document 3, where a nanoparticle has a core-shell structure.

That is, the nanoparticle 121 is composed of a core part 122 and a shell part 123 coating the core part 122, and the shell part 123 is coated with a surfactant 124. This surfactant 124 has a hole transporting ligand 124a and an electron transporting ligand 124b, and the hole transporting ligand 124a is localized closer to a hole transport layer 125, and the electron transporting ligand 124b is localized closer to an electron transport layer 126.

In Patent Document 3, the LUMO level 127 of the hole transporting ligand 124a is made higher than the LUMO level 128 of the electron transporting ligand 124b, thereby injecting electrons from the electron transport layer 126 into the core part 122, whereas the LUMO level 127 of the hole transporting ligand 124a is made higher than the lowest electron level 129 in the conduction band (for electron transfer) of the core part 122, thereby causing the hole transporting ligand 124a to serve as a barrier to electrons, and thus, electrons are confined within the core part 122.

In addition, the HOMO level 130 of the electron transporting ligand 124b is made lower than the HOMO level 131 of the hole transporting ligand 124a, thereby injecting holes from the hole transport layer 125 into the core part 122, whereas the HOMO level 130 of the electron transporting ligand 124b is made lower than the highest electron level 132 in the valence band (for hole transfer) of the core part 122, thereby causing the electron transporting ligand 124b to serve as a barrier to holes, and thus, holes are confined within the core part 122.

Here, the LUMO level refers to an energy level corresponding to the lowest unoccupied molecular orbital of molecular orbitals that are not occupied by electrons in the case where molecules irradiated with light bring energy into an excited state and bring the molecular orbitals into an empty state occupied by no electron.

In addition, the HOMO level refers to an energy level corresponding to the highest occupied molecular orbital of molecular orbitals in a ground state in the case where electrons occupy the molecular orbitals in order from the molecular orbitals with the lowest energy in the ground state before molecules are irradiated with light.

In such a manner, in Patent Document 3, due to the electron block effect of the hole transporting ligand 124a and the hole bock effect of the electron transporting ligand 124b, carriers (electrons and holes) are confined within the core part 122 of the nanoparticle 121.

Then, electrons and holes are confined within the core part 122 in such a manner to thereby recombine electrons and holes in the core part 122 and cause excitons to produce luminescence.

Patent Document 1: Japanese Patent Application Laid-Open No. 2002-184970 (claim 1, FIG. 1)

Patent Document 2: Japanese Patent Application Laid-Open No. 2006-185985 (claim 1, FIG. 1)

Patent Document 3: Japanese Patent Application Laid-Open No. 2008-214363 (claims 1 to 5)

SUMMARY OF THE INVENTION

However, in Patent Document 1 (FIG. 23), while crystals have few surface defects because the InGaAs constituting the quantum dots 103 is formed by epitaxial growth, the InGaAs has some of In substituted with Ga, and therefore makes a small difference in bandgap energy between the InGaAs and the GaAs that forms the substrate 101 and the coating layer 102, and has poor performance of confining carriers.

That is, when the quantum dots are used for a light-emitting layer of a light-emitting device, there is a need to effectively confine holes and electrons in the quantum dots 103, recombine the holes and the electrons in the quantum dots 103, and cause excitons to produce luminescence.

However, in the Patent Document 1, since the difference in bandgap energy is small between the InGaAs that forms the quantum dots 103 and the GaAs that forms the substrate 101 and the coating layer 102, there is a possibility that without recombination of holes transported from a hole transport layer and electrons transported from an electron transport layer in the quantum dots 103, the holes will be transported to the electron transport layer side, and the electrons will be transported to the hole transport layer side, thereby resulting in poor performance of confining carriers into the quantum dots 103.

In addition, in Patent Document 2 (FIG. 24), while the efficiency of injecting carriers into the quantum dot layer 113 is improved by the use of the tunnel effect, it is difficult to effectively confine carriers in the quantum dot layer 113, and thus there has been a problem that the carrier recombination probability is poor and a sufficient luminescent efficiency cannot be obtained.

In addition, in Patent Document 3 (FIG. 25), while the function of confining carriers in the nanoparticle 121 is improved by adjusting the energy levels of the surfactant 124 and the core part 122 of the nanoparticle 121 as mentioned above, a surfactant material and a core material have to be selected such that a certain difference in energy level is provided between the surfactant 124 and the core part 122, the materials are restricted largely, and the degree of freedom for design is also low.

In addition, in this type of light-emitting device, in order to achieve further improved emission characteristics, there is a need to not only effectively confine carriers in the nanoparticle 121, but also improve the efficiency of injecting carriers into the nanoparticle 121 (quantum dot). However, Patent Document 3 makes no mention of the foregoing respect, but further improved characteristics have been demanded.

On the other hand, as a measure for improving the function of confining carriers, it is also conceivable to interpose a hole block layer 134 between a shell part 132 and an electron transport layer 133 as illustrated in FIG. 26.

That is, in FIG. 26, a quantum dot 131 that forms a light-emitting layer has a core-shell structure including a core part 135 and a shell part 132.

Then, the quantum dot 131 is interposed between a hole transport layer 136 and the electron transport layer 133, and between the shell part 132 and the electron transport layer 133, the hole block layer 134 is interposed which is formed from an electron transporting material such that the energy level vb1 of a valence band on the basis of a vacuum level is lower than the energy level vb2 of the valence band of the electron transport layer 133 or the HOMO level h1 of the electron transport layer 133.

In the light-emitting device configured in such a manner, as indicated by an arrow a, holes injected from the hole transport layer 136 into the quantum dot 131 can be prevented from leaking to the outside of the quantum dot 131, such as the electron transport layer 133, while the hole block layer 134 serves as a barrier. That is, the interposition of the hole block layer 134 with a predetermined energy level between the shell part 132 and the electron transport layer 133 is considered to retain and accumulate holes in the core part 135, thus making it possible to be efficiently recombine, in the core part 135, the holes with electrons injected from the electron transport layer 133 into the quantum dot 131, as indicated by an arrow b.

However, in the light-emitting device in FIG. 26, there is a need to newly provide the hole block layer 134 between the quantum dot 131 and the electron transport layer 133, and there is a possibility of increasing the number of steps in the manufacturing process, or increasing the cost. Moreover, in order to effectively block holes so as to keep the holes from leaking to the outside, the hole block layer 134 needs to have a predetermined energy level as described above, and an electron transport property, and thus there is a possibility of causing new problems such as large restriction on materials.

The present invention has been made in view of these circumstances, and an object of the present invention is to provide a nanoparticle material favorable for a light-emitting device material, which suppresses the leakage of holes injected into the nanoparticle material to the outside of the nanoparticle material to improve the recombination probability while maintaining the efficiency of injecting carriers into the nanoparticle material, thereby enabling high-efficiency luminescence, and a light-emitting device that uses the nanoparticle material for a light-emitting layer.

In nanoparticles that have a core-shell structure, shell parts are formed mainly for removing surface defects of core parts to inactivate the surfaces, and thus typically formed from a material that is higher in bandgap energy than the core parts.

Therefore, hole blocking performance is considered to be able to be improved by increasing the thickness of the shell part to the extent that carrier transport properties and the like are not damaged.

The present inventors have earnestly carried out research from the foregoing perspective and have found that if the thickness of the shell part is made 3 to 5 monolayers (hereinafter, referred to as "ML") based on the constituent molecule of the shell part, it is possible to improve hole blocking performance while avoiding a decrease in carrier transport properties as much as possible, without generating any surface defect due to lattice mismatch between a nanoparticle material and the core material, and even when the nanoparticle material is used for a light-emitting layer of a light-emitting device.

Then, in this type of nanoparticle material, typically, the shell part has a surface coated with a surfactant, and with design for the type of the surfactant, the material is considered to be applicable to light-emitting devices including light-emitting layers that have various quantum dot structures.

The present invention has been made on the basis of this finding, and a nanoparticle material according to the present invention has a core-shell structure including a core part and a shell part coating the core part, the shell part has a surface coated with a surfactant, and the shell part has a thickness of 3 to 5 ML based on the constituent molecule of the shell part.

Here, the ML (monolayer) based on the constituent molecule refers to the average number of particles in the thickness direction of the closest packed nanoparticles in the material, and for example, the term of 1 ML means a monomolecular layer.

In addition, in the nanoparticle material according to the present invention, preferably the surfactant includes a first surfactant that has a hole transport property and a second surfactant that has an electron transport property, and the shell part has a surface coated with at least both of the first and second surfactants.

Thus, the leakage of holes to the outside can be suppressed while a carrier transport property is ensured.

In addition, in the nanoparticle material according to the present invention, the first surfactant preferably has a valence band that achieves a tunneling resonance with a valence band of the core part and an excitation level of the valence band.

Thus, it becomes possible to achieve hole migration through the use of the tunneling resonance, and holes can be injected into the nanoparticle material quickly and efficiently without generation of any phonon bottleneck.

In addition, in the nanoparticle material according to the present invention, the second surfactant preferably has a conduction band that achieves a tunneling resonance with a conduction band of the core part and an excitation level of the conduction band.

Thus, it becomes possible to achieve electron migration through the use of the tunneling resonance, and electrons can be injected into the nanoparticle material quickly and efficiently without generation of any phonon bottleneck.

In addition, in the nanoparticle material according to the present invention, the surfactant coating the surface of the shell part preferably has an electron transport property.

Thus, the leakage of holes to the outside can be suppressed effectively while the electron transport property of the surfactant is ensured.

Also in this case, as mentioned above, the second surfactant preferably has a conduction band that achieves a tunneling resonance with a conduction band of the core part and an excitation level of the conduction band.

In addition, in the nanoparticle material according to the present invention, the surfactant coating the surface of the shell part preferably has an insulating property.

In this case, the combination with quantum dots that are given electron-transporting and hole-transporting surfactants makes it possible to realize a high-efficiency light-emitting device which can suppress the leakage of holes to the outside while ensuring a carrier transport property.

In addition, in the nanoparticle material according to the present invention, the shell part has preferably a lower energy level of a valence band on the basis of a vacuum level than an energy level of a valence band of the core part.

Thus, holes injected from the outside to the nanoparticle material can be blocked effectively by the shell part. Therefore, the hole block function can be ensured without the need to newly provide a hole block layer or the like.

In addition, a light-emitting device according to the present invention is a light-emitting device including a light-emitting layer interposed between a hole transport layer and an electron transport layer, and emitting light with an electric current injected into the light-emitting layer, and the light-emitting layer has a stacked structure including a first light-emitting layer composed of a first quantum dot formed from the nanoparticle material mentioned above, and a second light-emitting layer composed of a second quantum dot having a core-shell structure formed to have a shell part of less than 3 ML in thickness on the basis of a constituent molecule of the shell part, the shell part of the second quantum dot has a surface coated with both a first surfactant that has a hole transport property and a second surfactant that has an electron transport property, and the first light-emitting layer is disposed closer to the electron transport layer, and the second light-emitting layer is disposed closer to the hole transport layer.

In addition, a light-emitting device according to the present invention is a light-emitting device including a light-emitting layer interposed between a hole transport layer and an electron transport layer, and emitting light with an electric current injected into the light-emitting layer, and the light-emitting layer has a stacked structure including a first light-emitting layer composed of a first quantum dot formed from the nanoparticle material mentioned above, and a second light-emitting layer composed of a second quantum dot having a core-shell structure formed to have a shell part of less than 3 ML in thickness on the basis of a constituent molecule of the shell part, the shell part of the second quantum dot has a surface coated with both a first surfactant that has a hole transport property and a second surfactant that has an electron transport property, and the first light-emitting layer is disposed closer to the electron transport layer, and the second light-emitting layer is disposed closer to the hole transport layer.

In addition, a light-emitting device according to the present invention is a light-emitting device including a light-emitting layer interposed between a hole transport layer and an electron transport layer, and emitting light with an electric current injected into the light-emitting layer, and the light-emitting layer has a stacked structure including a first light-emitting layer composed of a first quantum dot formed from the nanoparticle material mentioned above, and a second light-emitting layer composed of a second quantum dot having a core-shell structure formed to have a shell part of less than 3 ML in thickness on the basis of a constituent molecule of the shell part, the shell part of the second quantum dot has a surface coated with both a first surfactant that has a hole transport property and a second surfactant that has an electron transport property, and the first light-emitting layer is disposed closer to the electron transport layer, and the second light-emitting layer is disposed closer to the hole transport layer.

In addition, in the light-emitting device according to the present invention, the first light-emitting layer preferably has a thickness of 0.5 to 2 ML on the basis of the particle size of the first quantum dot.

Here, the ML (monolayer) on the basis of the particle size refers to the number of layers in the case of converting the particle of the quantum dot to an equivalent film thickness, and for example, corresponds to 0.5 ML when quantum dots are present at only about half a density in a plane.

In such a manner, the thickness of the first light-emitting layer formed from the first quantum dot that has no carrier transport property is defined to shorten the migration distance of carriers, thereby making is possible to avoid the decrease in the injection efficiency of carriers into the quantum dots as much as possible.

In addition, in the light-emitting device according to the present invention, each of the shell parts of the first and second quantum dots preferably has a lower energy level of a valence band on the basis of a vacuum level than the energy level of the valence band of the electron transport layer or the HOMO level of the electron transport layer.

Thus, even when the electron transport layer has no hole block function, the leakage of holes to the outside of the quantum dots can be prevented by the hole blocking performance of the shell part.

The nanoparticle material according to the present invention has the core-shell structure including the core part and the shell part coating the core part, the shell part has the surface coated with the surfactant, and the shell part has a thickness of 3 to 5 ML based on the constituent molecule of the shell part, and thus has an adequate thickness. Thus, even when the nanoparticle material is used for a light-emitting layer of a light-emitting device, the hole blocking performance can be improved while a decrease in carrier transport properties is avoided as much as possible, without generation of any surface defect due to lattice mismatch between the nanoparticle material and the core material.

In addition, since the first and second quantum dots both can ensure carrier transport properties, the first and second quantum dots improve the efficiency of injecting carriers, while the first quantum dots with the shell parts of 3 to 5 ML in thickness can ensure a hole block function, thereby making it possible to realize a high-efficiency light-emitting device which has various types of excellent emission characteristics including a low drive voltage and a favorable hole block function.

In addition, when the second quantum dot has a carrier transport property, and the first quantum dot has a hole block function while ensuring an electron transport property, thereby enabling holes to be accumulated and recombined with electrons near the interface between the first light-emitting layer and the second light-emitting layer, or enabling the recombination of electrons with holes localized near the shell part of the second quantum dot near the hole transport layer, it is possible to realize a light-emitting device which emits light with high efficiency.

In addition, since the first quantum dot with the shell part of 3 ML to 5 ML in thickness has no carrier transport property while the second quantum dot with the shell part of less than 3 ML in thickness has a carrier transport property, holes and electrons can be localized intensively and recombined near the interface between the first quantum dot and the second quantum dot, and a light-emitting device can be realized which is able to emit light with high efficiency.

BRIEF EXPLANATION OF THE DRAWINGS

FIG. 23 is a cross-sectional view for explaining the prior art described in Patent Document 1.

FIG. 24 is a cross-sectional view for explaining the prior art described in Patent Document 2.

FIG. 25 is a band structure diagram of an energy band illustrating a confinement principle for carriers in Patent Document 3.

FIG. 26 is a band diagram in the case of interposing a hole block layer between a shell part and an electron transport layer.

DETAILED DESCRIPTION OF THE INVENTION

Next, embodiments of the present invention will be described in detail.

First Embodiment

Figure 1:
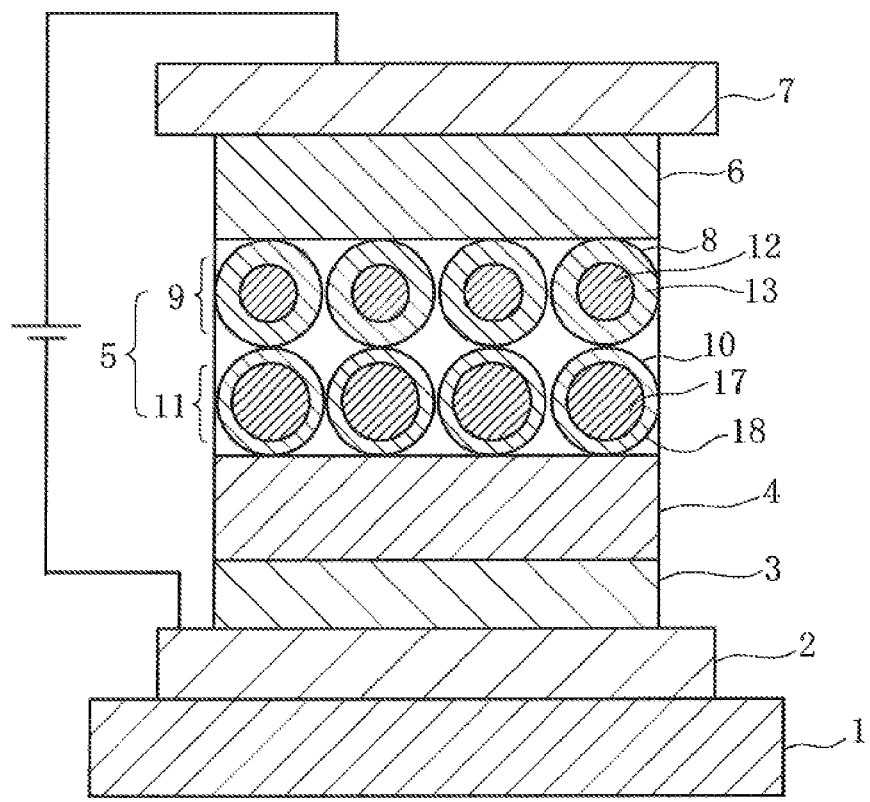
FIG. 1 is a cross-sectional view schematically illustrating a first embodiment of an EL element as a light-emitting device according to the present invention.

FIG. 1 is a cross-sectional view schematically illustrating a first embodiment of an EL element as a light-emitting device according to the present invention, where a light-emitting layer is formed from a nanoparticle material according to the present invention.

This EL element has an anode 2 formed on a transparent substrate 1 such as a glass substrate, a hole injection layer 3 and a hole transport layer 4 composed of hole transporting materials sequentially formed on the surface of the anode 2, and a light-emitting layer 5 formed on the surface of the hole transport layer 4. In addition, an electron transport layer 6 of an electron transporting material is formed on the surface of the light-emitting layer 5, and a cathode 7 is formed on the surface of the electron transport layer 6.

The light-emitting layer 5 has a stacked structure including a first light-emitting layer 9 where first quantum dots 8 that is a nanoparticle material according to the present invention are aligned in a matrix, and a second light-emitting layer 11 where second quantum dots 10 that differ in shell thickness from the quantum dots 8 are aligned in a matrix.

It is to be noted that while the first quantum dots 8 and the second quantum dots 10 are both formed as monolayers in the first embodiment, the first quantum dots 8 and the second quantum dots 10 may be both stacked to provide two or more layers, as in a second embodiment as will be described later.

Figure 2:
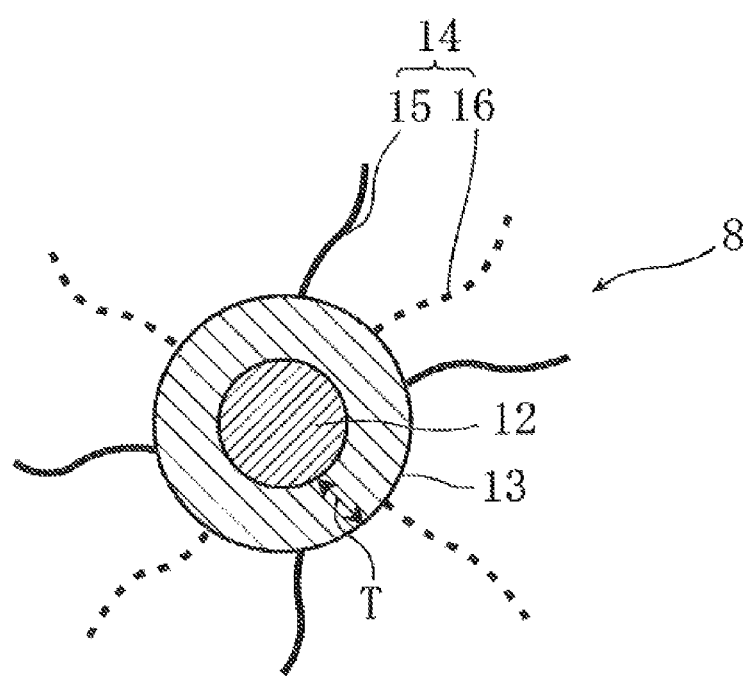
FIG. 2 is a cross-sectional view schematically illustrating a nanoparticle material (first quantum dot) according to the present invention.

Then, the first quantum dot 8 has, as illustrated in FIG. 2, a core-shell structure including a core part 12 and a shell part 13 coating the core part 12, and the surface of the shell part 13 is coated with two types of surfactants 14 that differ in transport property. That is, the surface of the shell part 13 is coated with both a first surfactant 15 that has a hole transport property and a second surfactant 16 that has an electron transport property.

In addition, the shell part 13 has a thickness T of 3 to 5 ML on the basis of the constituent molecule of the shell part 13.

Here, the ML (monolayer) on the basis of the constituent molecule refers to the average number of particles in the thickness direction of the closest packed nanoparticles in the material. For example, in a case where the surface of the core part 12 is coated with a shell material to form the shell part 13, when an average value of the number of particles in the thickness direction of the shell part 13 is "3" in the closest packing of nanoparticles to serve as the shell material, the ML corresponds to "3 ML on the basis of the constituent molecule of the shell part," and when an average value of the number of particles in the thickness direction of the shell part 13 is "5", the ML corresponds to "5 ML on the basis of the constituent molecule of the shell part."

Figure 3:
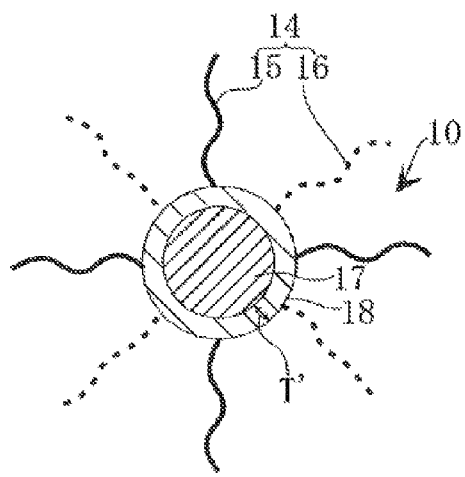
FIG. 3 is a cross-sectional view schematically illustrating a second quantum dot.

The second quantum dot 10 has, as illustrated in FIG. 3, a core-shell structure including a core part 17 and a shell part 18 coating the core part 17, and the surface of the shell part 18 is coated with two types of surfactants 19 that differ in transport property as with the first quantum dot 8. That is, the surface of the shell part 18 is coated with the first surfactant 15 that has a hole transport property and the fifth surfactant 16 that has an electron transport property. Then, the shell part 18 has a thickness T' of less than 3 ML on the basis of the constituent molecule of the shell part 18.

In such a manner, according to the present embodiment, the first and second quantum dots 8, 10 each with the coexistence of both the first surfactant 15 and second surfactant 16 coat the surfaces of the shell parts 13, 18, thereby respectively transporting only holes and only electrons through the surfactant 14 (the first surfactant 15 and the second surfactant 16). Then, as a result, the recombination of electrons and holes in the surfactant 14 is suppressed, thereby making it possible to efficiently inject carriers into the first and second quantum dots 8, 10.

It is to be noted that the first and second quantum dots 8, 10 are both illustrated with the surfactant 14 omitted in FIG. 1.

Then, as described above, the shell part 13 of the first quantum dot 8 has the thickness T of 3 to 5 ML on the basis of the constituent molecule of the shell part 13, and the shell part 18 of the second quantum dot 10 has the thickness T of less than 3 ML on the basis of the constituent molecule of the shell part 18.

Figure 4:
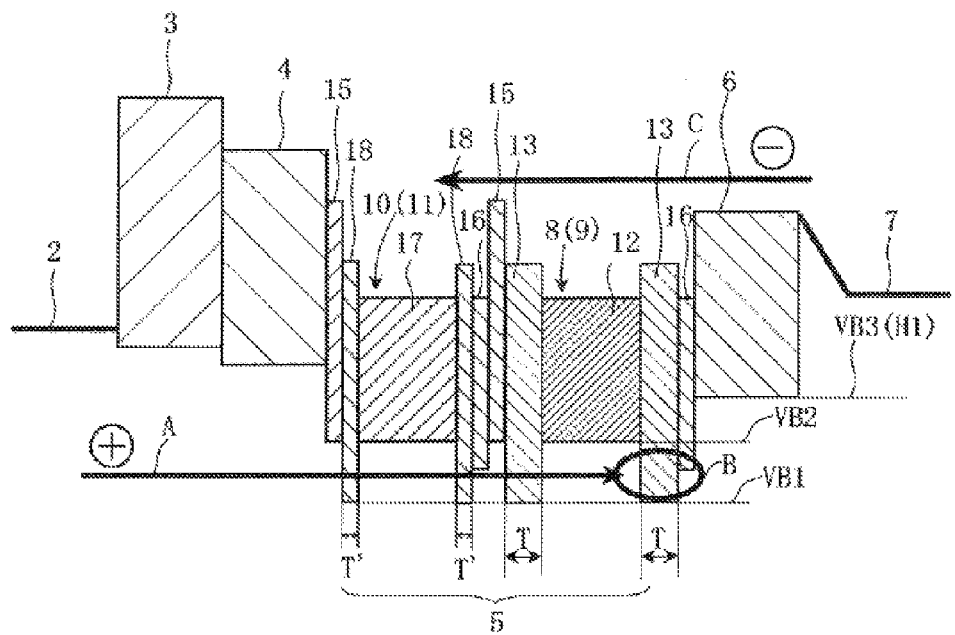
FIG. 4 is a band structure diagram illustrating an energy band according to the first embodiment.

FIG. 4 is a band structure diagram illustrating an energy band of the EL element.

The energy level VB1 of valence bands on the basis of a vacuum level of the shell parts 13, 18 is lower than the energy level VB2 of valence bands of the core parts 12, 17. That is, as mentioned in the section of [Means for solving the problem], the shell parts 13, 18 are formed mainly for inactivating surface defects of the core parts 12, 17 and thus formed with the use of materials that are larger in bandgap energy Eg than that of the core parts 12, 17.

Then, in order to efficiently recombine carriers in the first and/or second quantum dots 8, 10, there is a need for the shell parts 13 of the first quantum dots 8 to block the leakage of holes to the outside such as the electron transport layer 6.

However, when the thickness T of the shell part 13 of the first quantum dot 8 is made small to be less than 3 ML on the basis of the constituent molecule of the shell part 13, holes easily pass through shell part 13. For this reason, in order to ensure the hole block function with the use of the shell part 13, there is a need for the thickness T of the shell part 13 of the first quantum dot to be at least 3 ML or more.

However, when the thickness T of the shell part 13 increases to exceed 5 ML on the basis of the constituent molecule of the shell part 13, the thickness T of the shell part 13 becomes excessively large, and thus there is a possibility of causing lattice mismatch between the core material and the shell material, and for this reason, unfavorably increasing surface defects.

On the other hand, since the leakage of holes to the outside can be blocked by shell parts 13 of the first quantum dots 8, there is no need to take into account the hole block function for the second quantum dots 10, but there is a need to inject holes quickly and efficiently into the second quantum dots 10. Then, in order to inject holes quickly and efficiently into the second quantum dots 10 with the use of the tunneling effect, the shell parts of the second quantum dots are desirably made smaller in film thickness than the shell parts 13 of the first quantum dots 8.

In such a manner, the thickness T' of the shell part 18 of second quantum dot 10 is less than 3 ML from the perspective of ensuring a favorable hole injection efficiency. It is to be noted that as for the second quantum dot 10, the lower limit of the thickness T' of the shell part 18 is not particularly limited, but for sufficiently inactivating surface defects of the core part 17, the shell part 18 is preferably formed to have the thickness T' of 1 ML or more.

In such a manner, according to the present first embodiment, the thicknesses T, T' of the shell parts 13, 18 are defined as described above, and thus holes can be injected efficiently into the second quantum dot 10 from the hole transport layer 4 through the tunneling resonance, as indicated by an arrow A. In addition, the shell part 13 of the first quantum dot 8 can exhibit the hole block function to prevent the leakage to the outside (as indicated by B in the figure), and thus holes can be retained and accumulated in the core parts 12, 17, and recombined with electrons injected from the electron transport layer 6, thereby making high-efficiency luminescence possible.

That is, the first quantum dots 8 with the thick shell parts 13 of 3 to 5 ML in thickness T are combined with the second quantum dots 10 with the thin shell parts 18 of less than 3 ML in thickness T', and the first light-emitting layer 9 composed of the first quantum dots 8 is disposed closer to the electron transport layer 6, and the second light-emitting layer 11 composed of the second quantum dots 10 is disposed closer to the hole transport layer 4, thereby suppressing the leakage of holes to the outside while ensuring a carrier injection efficiency, and thus making it possible to realize a high-efficiency light-emitting device.

It is to be noted that according to the present invention, the relationship between the energy levels of the shell parts 13, 18 and electron transport layer 6 is not particularly limited, and the scope of the present invention also encompasses, for example, a case where the energy level VB1 of the valence band on the basis of the vacuum level of the shell parts 13, 18 is higher than the energy level VB3 of the valence band of the electron transport layer 6 or the HOMO level H1 of the electron transport layer 6.

However, as illustrated in FIG. 4, when the energy level VB1 of the valence band on the basis of the vacuum level of the shell parts 13, 18 is lower than the energy level VB3 of the valence band of the electron transport layer 6 or the HOMO level H1 of the electron transport layer 6, the electron transport layer 6 is able to serve also to provide a hole block function, which is particularly effective, and more preferred.

Then, the core materials that form the core parts 12, 17 are not particularly limited as long as the core material is a material that produces luminescence in a visible light region, and CdSe, CdTe, ZnSe, ZnTe, InP, InAs, GaP, GaAs, ZnS: CuInS, ZnS:CuInGaS, Si, Ge, and the like can be used as the core material.

In addition, as the shell materials that form the shell parts 13, 18, materials can be used which have a higher bandgap energy Eg than that of the core material such that the energy level VB1 of the valence band on the basis of the vacuum level is lower than the energy level VB2 of the valence band of the core material, and for example, sulfides such as ZnS and CdS, oxides such as ZnO, $SiO_2$, $TiO_2$, and $Al_2O_3$, nitrides such as GaN and AlN, and selenides such as ZnSe and CdSe can be selected appropriately and used.

In addition, a low-molecular material for the hole transport layer with a ligand introduced therein can be used as the first surfactant 15 that has a hole transport property.

As the low-molecular material for the hole transport layer, for example, N,N'-diphenyl-N,N'-bis(3-methylphenyl)-1,1'-biphenyl-4,4'-diamine (TPD), 4,4'-bis[N-(1-naphthyl)-N-phenyl-amino]biphenyl (α-NPD), 4,4',4"-tris(2-naphthyl-phenylamino)triphenylamine (2-TNATA), N,N'-7-di(1-naphthyl)-N,N'-diphenyl-4,4'-diaminobiphenyl (Spiro-NPB), 4,4',4"-tris(3-methylphenylphenylamino)triphenylamine (m-MTDATA), and derivatives thereof can be used.

In addition, the ligand is not particularly limited as long as the ligand is a polar group, and for example, one, or two or more groups such as a thiol group (—SH), an amino group (—$NH_2$), a carboxyl group (—COOH), a carbonyl group (—CO), a nitro group (—$NO_2$), a phosphino group (—$PH_2$), and a phosphoroso group (—PO) can be used.

Therefore, for example, a TPD-thiol ligand of TPD with a thiol group introduced therein, an α-NPD-amino ligand of α-NPD with an amino group introduced therein, or the like can be used as the first surfactant 15 that has a hole transport property. Then, when the number of ligands introduced is 1, the surfactant can be dispersed in a non-polar solvent, and when the number of ligands introduced is 2 or more, the surfactant can also be dispersed in a polar solvent.

It is to be noted that polymer materials such as poly(3,4-ethylenedioxythiophene):poly(styrenesulfonate) (hereinafter, referred to as "PEDOT:PSS") can be used favorably as materials for the hole transport layer, but is not used preferably for materials for the hole-transporting surfactant. This is because the polymer materials have large molecular sizes, which result in steric hindrances, and thus fail to shorten the distance between neighboring molecules, and as a result, the surface coverages of the shell parts 13, 18 decrease, thereby causing a decrease in quantum yield, or failing to increase the density of the quantum dot layer.

In addition, a material for the electron transport layer with a ligand introduced therein can be used as the second surfactant 16 that has an electron transport property.

As the material for the electron transport layer, for example, 2-(4-biphenylyl)-5-(4-t-butylphenyl)-1,3,4-oxadiazole (PBD), 2,2',2"-(1,3,5-benzonitrile)-tris(1-phenyl-1-H-benzoimidazole (TPBi), 2,9-dimethyl-4,7-diphenyl-1,10-phenanthroline (BCP), 3-(benzothiazole-2-yl)-7-(diethylamino)-2H-1-benzopyran-2-on (coumarin 6), bis(2-methyl-8-quinolinolato)-4-(phenylphenolato)aluminum (BAlq), 4,4'-bis(9-carbazolyl)-2,2'-dimethylbiphenyl (CDBP), and derivatives thereof can be used.

In addition, the ligand is not particularly limited as long as the ligand is a polar group as with the first surfactant 15, and for example, a thiol group (—SH), an amino group (—NH$_2$), a carboxyl group (—COOH), a carbonyl group (—CO), a nitro group (—NO$_2$), a phosphino group (—PH$_2$), and a phosphoroso group (—PO) can be used.

Therefore, for example, a PBD-thiol ligand of PBD with a thiol group introduced therein, a BCP-amino ligand of BCP with an amino group introduced therein, or the like can be used as the second surfactant 16 that has an electron transport property.

It is to be noted that tris (8-hydroxyquinoline)aluminum (Alq3) can be used favorably as a material for the electron transport layer, but is not used preferably for the second surfactant 16. This is because Alq3 is poor in solubility, has a low ligand density, and thus is difficult to use, and moreover, is easy to produce luminescence, and thus has a possibility of recombining with holes in the surfactant and producing excitons.

In addition, there is a need to avoid mixing of the first surfactant 15 and the second surfactant 16 with each other, and thus there is a need for the dispersing solvent for the first surfactant 15 and the dispersing solvent for the second surfactant 16 to be opposite in polarity. That is, for example, when a non-polar solvent such as toluene is used for the dispersing solvent for the first surfactant 15, there is a need to use a polar solvent such as methanol for the dispersing solvent for the second surfactant 16, and materials that are at least suitable for the dispersing solvents are selected for the first surfactant 15 and the second surfactant 16.

In the EL element formed in such a manner, carriers are injected into the anode 2 and the cathode 7 when a voltage is applied between the anode 2 and the cathode 7. Then, the holes injected into the anode 2 are injected into the second quantum dots 10 through a bulk-hetero network of the first surfactant 15 on the surfaces of the shell parts 18. Then, the holes are blocked by the shell parts 13 of the first quantum dots 8, and thus accumulated and retained mainly in the core parts 17 of the second quantum dots 10. On the other hand, the electrons injected into the cathode 7 are injected mainly into the second quantum dots 10 through a bulk-hetero network of the second surfactant 16 of the first quantum dots 8 and the second surfactant 16 of the second quantum dots 10, and the electrons and the holes are recombined efficiently to produce exciton luminescence.

That is, the second quantum dots 10 ensure an injection efficiency, and the first quantum dots 8 ensure a hole block function, thus making it possible to realize an EL element which has a low drive voltage, has favorable luminance characteristics, has a luminescent efficiency dramatically improved, has a favorable purity of luminescent color, and produces luminescence with high efficiency.

Furthermore, the first surfactant 15 that has a hole transport property preferably has such a HOMO level H2 that achieves a tunneling resonance with the energy level VB2 of the valence bands of the core parts 12, 17, which are energy bands for hole migration, and the second surfactant 16 that has an electron transport property preferably has such a LUMO level L1 that achieves a tunneling resonance with the energy level CB1 of the conduction bands of the core parts 12, 17, which are energy bands for electron migration.

Then, use of the tunneling resonances in such a manner makes it possible for carriers to easily pass through energy barriers, thereby making it possible to realize efficient carrier migration.

Figure 5:
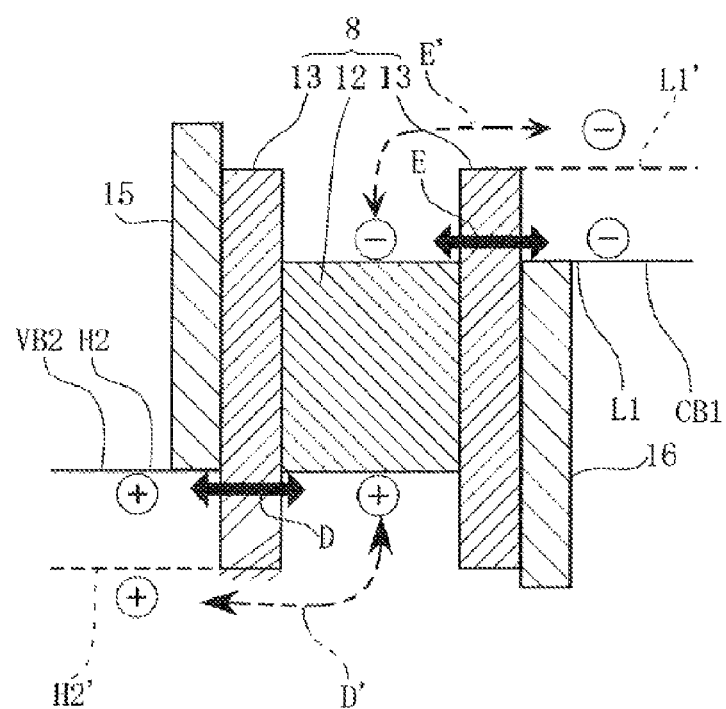
FIG. 5 is a schematic view illustrating the principle of carrier migration through tunneling resonances.

FIG. 5 is a schematic view illustrating the principle of carrier migration through tunneling resonances.

It is to be noted that while FIG. 5 illustrates a case where the core part 12 of the first quantum dot 8 achieves a tunneling resonance with the first and second surfactants 15, 16, the same applies to the second quantum dot 10.

That is, in order to improve the carrier transport efficiency, carrier migration between the core part 12 and the first and second surfactants 15, 16 is desirably also carried out quickly to improve the efficiency of injecting carriers into the first quantum dot 8.

However, when the HOMO level H2' of the first surfactant 15 and the energy level VB2 of the valence band of the core part 12 have a large difference in energy level such that no tunneling resonance is achieved, holes migrate in such a manner that the holes cross over an energy barrier as indicated by an arrow D'.

Likewise, when the LUMO level L1' of the second surfactant 16 and the energy level CB1 of the conduction band of the core part 12 have a large difference in energy level such that no tunneling resonance is achieved, electrons migrate in such a manner that the electrons cross over an energy barrier as indicated by an arrow E'.

Moreover, phonon migration is slow in the quantum dot system, and a phonon bottleneck is produced by the rate-limiting slow phonon migration, thus making it difficult for carriers to migrate quickly.

Therefore, as described above, preferably, the first surfactant 15 has such a HOMO level H2 that achieves a tunneling resonance with the energy level VB2 of the valence band of the core part 12, and also the second surfactant 16 has such a LUMO level L1 that achieves a tunneling resonance with the energy level CB1 of the conduction band of the core part 12, thereby making it possible to carry out quick carrier migration as indicated by arrows D, E, and make an improvement in carrier transport efficiency.

In order to produce such tunneling resonances, the HOMO level H2 of the first surfactant 15 is preferably in the range of −0.2 to +0.2 eV with respect to the energy level VB2 of the conduction bands of the core parts 12, 17, and for example, in the case of using InP (valence band level: 5.7 eV) for the core parts 12, 17, a TPD-thiol ligand (HOMO level: 5.6 eV) can be used preferably.

In addition, the LUMO level L1 of the second surfactant 16 is preferably in the range of −0.2 to +0.2 eV with respect to the energy level CB1 of the conduction bands of the core parts 12, 17, and for example, in the case of using InP (conduction band level: about 3 eV) for the core parts 12, 17, a BCP-amino ligand (LUMO level: 3.2 eV) can be used preferably.

It is to be noted that the HOMO level H2 of the first surfactant 15 that has a hole transport property can be determined from bandgap energy estimated from a work function, and the LUMO level L1 of the second surfactant 16 that has an electron transport property can be determined from bandgap energy estimated from a work function and an absorption end of an absorption spectrum.

Next, a method for manufacturing the EL element mentioned above will be described.

First, two types of ultrafine particle dispersing solutions that differ in shell thickness, that is, first and second dispersing solutions are prepared.

Here while the core material and the shell material can be prepared with the use of various materials as described above, a case of using InP for the core material and ZnS for the shell material will be described as an example in the present first embodiment.

That is, for example, indium acetate, myristic acid, and octadecene are mixed in a container, and dissolved while being stirred in a nitrogen atmosphere, thereby preparing an indium-containing precursor solution. In addition, tristrimethylsilylphosphine, octylamine, and octadecene are mixed in a nitrogen atmosphere, thereby preparing a phosphorus-containing precursor solution.

Then, the indium-containing precursor solution is heated to a predetermined temperature (for example, 190° C.) and the phosphorus-containing precursor solution is injected into the heated solution. Then, the high temperature causes the precursor solutions with high degrees of activity to react with each other, indium and phosphorus bind to form a nucleus, and thereafter the nucleus reacts with the surrounding unreacted component to cause crystal growth, thereby preparing an InP quantum dot solution.

Next, a zinc oxide precursor solution of zinc oxide dissolved in stearic acid, and a sulfur precursor solution of sulfur dissolved in stearic acid are prepared.

Then, the zinc oxide precursor solution and the sulfur precursor solution are alternately dropped by minute amounts into the InP quantum dot solution adjusted to a predetermined temperature (for example, 150° C.), heated and cooled, and washed to remove excessive organic components in the solutions, thereby preparing raw material solutions.

Thereafter, the raw material solutions are dispersed in non-polar solvents (for example, toluene) while the first surfactant 15 is added to the solutions, thereby preparing first and second dispersing solutions.

That is, the thicknesses of the ZnS films to serve as the shell parts 13, 18 can be controlled easily by adjusting the concentrations of the zinc oxide precursor solution, sulfur precursor solution, and InP quantum dot solution, and further, the dropping frequencies and dropping amounts of the respective precursor solutions. Thus, the first raw material solution for ZnS films of 3 to 5 ML in film thickness and the second raw material solution for ZnS films of less than 3 ML in film thickness can be prepared.

Then, to each the first and second raw material solutions, the first surfactant 15 is added, and the first and second raw material solutions are dispersed in non-polar solvents to prepare first and second dispersing solutions.

In accordance with the present first embodiment, the EL element is prepared with the use of the first and second dispersing solutions.

FIGS. 6(a) to 6(d) and 7(e) to 7(h) are manufacturing process diagrams illustrating an example of a method for manufacturing the EL element mentioned above.

Figure 6A:
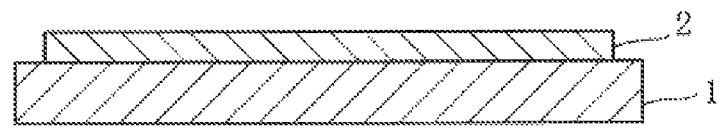
FIGS. 6(a) to 6(d) are manufacturing process diagrams (1/2) illustrating a method for manufacturing the light-emitting device (first embodiment).

First, as illustrated in FIG. 6(a), a conductive transparent material such as an ITO is deposited by a sputtering method on the transparent substrate 1 such as a glass substrate, and subjected to UV-ozone treatment to form the anode 2 of 100 nm to 150 nm in film thickness.

Next, a hole injection layer solution is prepared. The same material as the hole transporting material can be used as a material for the hole injection layer, and for example, PEDOT:PSS or the like can be used.

Figure 6B:
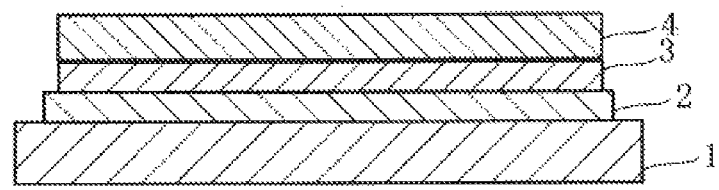

Then, a spin coating method or the like is used to apply the hole injection layer solution onto the anode 2, thereby forming the hole injection layer 3 of 20 nm to 30 nm in film thickness as illustrated in FIG. 6(b).

Next, a hole transport layer solution is prepared which is lower in HOMO level than the hole injection layer material. For example, when PEDOT:PSS is used, poly-TPD or the like that is lower in HOMO level than the PEDOT:PSS can be used as a material for the hole injection layer.

Then, a spin coating method or the like is used to apply the hole transport layer solution onto the positive electrode injection layer 3, thereby forming the hole transport layer 4 of 60 nm to 70 nm in film thickness.

It is to be noted that since the hole injection layer 3 mentioned above is provided to improve the hole transport property, the hole transport layer 4 may also serve as the hole injection layer 3, and in this case, the hole transport layer 4 can be formed only from poly-TPD, and the hole injection layer 3 can be omitted.

Next, the second dispersing solution described above is prepared.

Figure 6C:
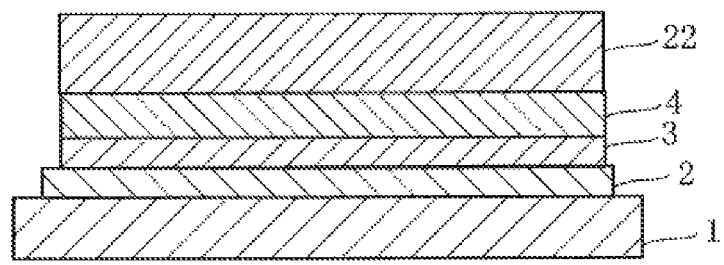

Then, a spin coating method or the like is used to apply the second dispersing solution onto the hole transport layer 4, and the solution is subjected to drying in a $N_2$ atmosphere to form a hole transporting quantum dot layer 22 as illustrated in FIG. 6(c).

Then, a third dispersing solution (hereinafter, referred to as a "substitution solution") is prepared which has the electron-transporting second surfactant 16 dispersed in a polar solvent (for example, methanol).

Here, for the dispersing solvent of the substitution solution, a solvent that is opposite in polarity to the dispersing solvent of the second dispersing solution, for example, a polar solvent such as methanol is used when toluene that is a non-polar solvent is used for the dispersing solvent of the second dispersing solution as in the present first embodiment.

It is to be noted that a material that has such a LUMO level that achieves a tunneling resonance with the energy level (about 3 eV) of the conduction band of InP as the core parts 17, for example, a TBD-amino ligand with the above-described LUMO level of about 2.9 eV is preferably used as the second surfactant 16.

Figure 6D:
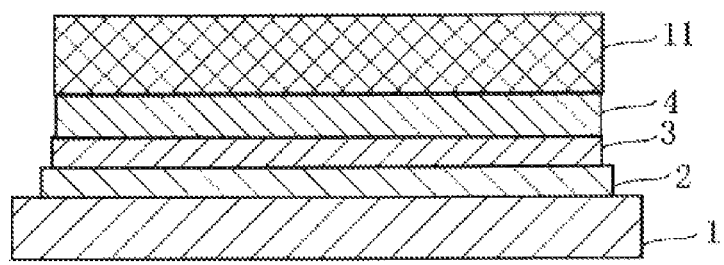

Next, the substrate 1 is immersed in the substitution solution to substitute some of the first surfactant 15 with the second surfactant 16, thereby forming the second light-emitting layer 11 with the second quantum dots 10 aligned in a matrix as illustrated in FIG. 6(d).

That is, when the substrate 1 with the hole-transporting quantum dot layer 22 formed therein is immersed in the substitution solution, a concentration gradient is formed from the surface in the film thickness direction between the first surfactant 15 and the second surfactant 16. Then, a portion close to the surface is substituted with the second surfactant 16 at a higher concentration, and a portion close to the substrate 1 has the first surfactant 15 maintaining and remaining at a higher concentration.

In addition, the following gradient of substitution proportion is produced, depending on the film thickness and the film density.

That is, while the first surfactant 15 is almost entirely substituted with the second surfactant 16 independently of the film thickness in a portion where the hole-transporting quantum dot layer 22 has a film density decreased by the substitution reaction for a sufficiently long period of time, the first surfactant 15 remains with only a surface substituted or without any substitution in a dense portion that has a high film density. In a portion where the hole-transporting quantum dot layer 22 is small in film thickness, the complete substitution is carried out by the substitution reaction for a sufficiently long period of time, even when the layer is a somewhat dense film. In addition, as the distance from the surface increases, the substitution rate is lower, and thus the substitution with the second surfactant 16 is difficult to occur, thereby producing a gradient in the substitution proportion of the first surfactant 15 with the second surfactant 16.

In such a manner, for a predetermined period of time (for example, 60 minutes) such that the first surfactant 15 and the second surfactant 16 coexist, the substrate 1 is immersed in the substitution solution to carry out ligand substitution. Thus, the second quantum dots 10 coated with the two types of surfactants of the first surfactant 15 and the second surfactant 16 are aligned in a matrix on the substrate 1, thereby preparing the second light-emitting layer 11.

Next, the first dispersing solution described above is prepared, and the first light-emitting layer 9 is formed on the second light-emitting layer 11 in accordance with the same method and procedure as described above.

Figure 7E:
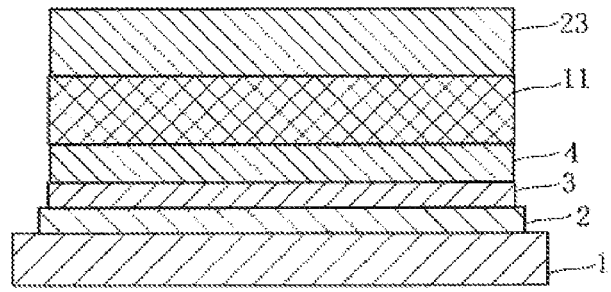
FIGS. 7(e) to 7(h) are manufacturing process diagrams (2/2) illustrating the method for manufacturing the light-emitting device (first embodiment).

That is, a spin coating method or the like is used to apply the first dispersing solution onto the second light-emitting layer 11, and the solution is subjected to drying in a $N_2$ atmosphere to form a hole-transporting quantum dot layer 23 as illustrated in FIG. 7(e).

Figure 7F:
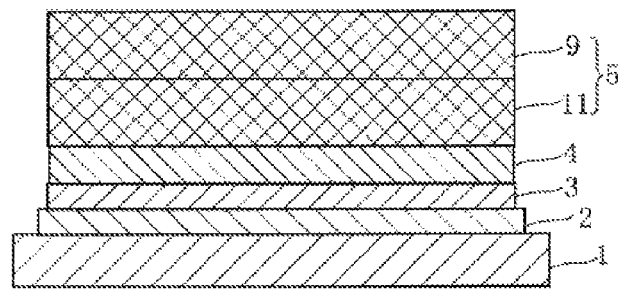

Then, the substrate 1 is immersed in the substitution solution containing the second surfactant 16 to substitute some of the first surfactant 15 with the second surfactant 16, thereby forming the first light-emitting layer 9 with the first quantum dots 8 aligned in a matrix as illustrated in FIG. 7(f).

The first light-emitting layer 9 and the second light-emitting layer 11 form the light-emitting layer 5.

Figure 7G:
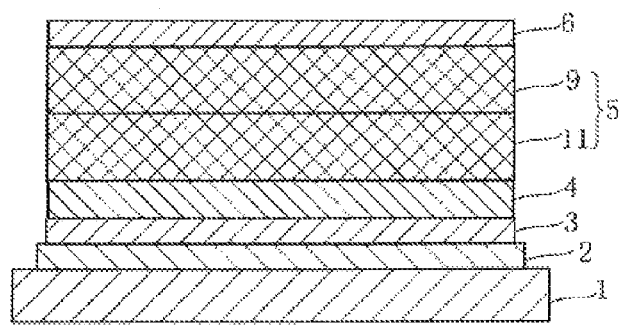

Next, an electron transporting material such as Alq3 is used to form, by a vacuum deposition method, the electron transport layer 6 of 50 nm to 70 nm in film thickness on the surface of the light-emitting layer 5 as illustrated in FIG. 7(g).

Figure 7H:
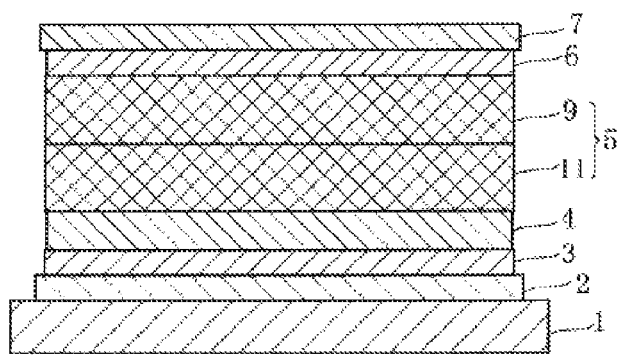

Then, as illustrated in FIG. 7(h), LiF, Al, or the like is used to form, by a vacuum deposition method, the cathode 7 of 100 nm to 300 nm in film thickness, thereby preparing the EL element.

In such a manner, in accordance with the present first embodiment, the hole-transporting quantum dot layers 22, 23 are deposited onto the substrate 1, and then immersed in the substitution solution containing the second surfactant 16 to substitute some of the first surfactant 15 with the second surfactant 16 and cause the two types of surfactants to coexist, and thus, the surfactants coordinated on the surfaces of the shell parts 13, 18 do not peel off the shell parts 13, 18. Therefore, the inactivation of surface defects can be maintained without decrease in the surface coverage of the surfactants covering the shell parts 13, 18, and an EL element can be obtained which has a favorable quantum yield.

Moreover, due to the coexistence of the first surfactant 15 with the second surfactant 16, only holes, or only electrons can be transported, thereby making it possible to improve the carrier transport efficiency without any recombination of electrons and holes in the surfactants.

That is, the present EL element has, as described above, a favorable carrier transport property, and thus also has a favorable injection efficiency, and achieves efficient recombination in the first and second quantum dots 8, 10, in particular, in the second quantum dots 10, thus making it possible to obtain an EL element which has, in spite of its low drive voltage, favorable emission characteristics such as luminance characteristics, luminescent efficiency, and purity of luminescent color.

Moreover, according to the present first embodiment, the EL element can be manufactured inexpensively and efficiently without the need for more than one cumbersome deposition process as in dry processes.

Second Embodiment

Figure 8:
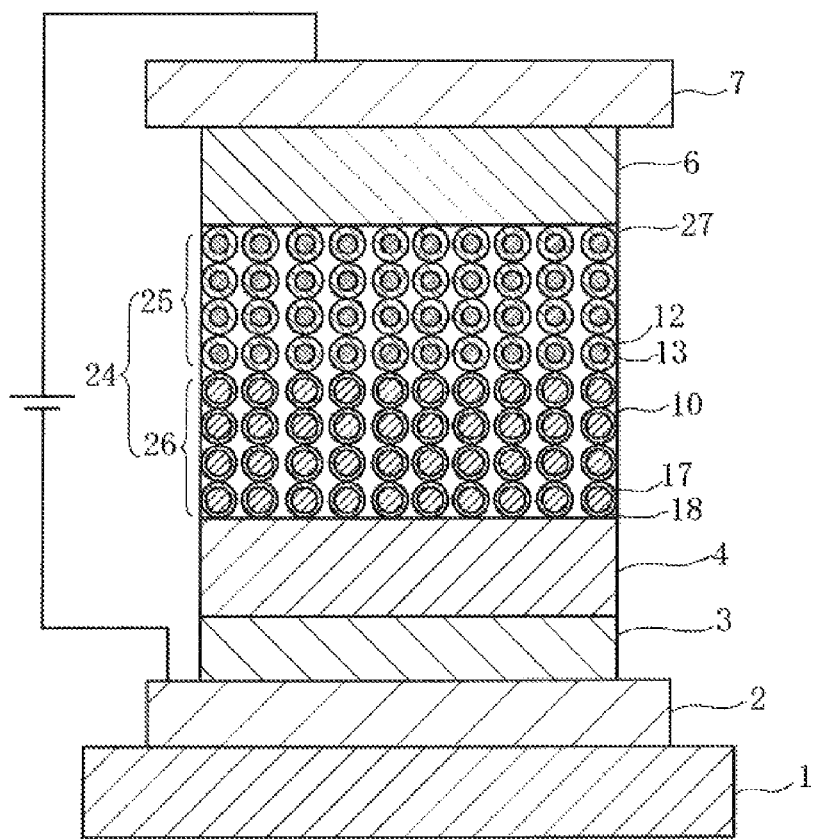
FIG. 8 is a cross-sectional view schematically illustrating a second embodiment of a light-emitting device according to the present invention.

FIG. 8 is a cross-sectional view schematically illustrating a second embodiment of an EL element as a light-emitting device according to the present invention.

This EL element has a light-emitting layer 24 that has a stacked structure of a first light-emitting layer 25 composed of first quantum dots 27 and a second light-emitting layer 26 composed of second quantum dots 10. Then, the second quantum dots 10 have shell parts 18 coated with respective hole-transporting and electron-transporting surfactants, and on the other hand, the first quantum dots 27 have shell parts 13 coated only with the electron-transporting surfactant.

Figure 9:
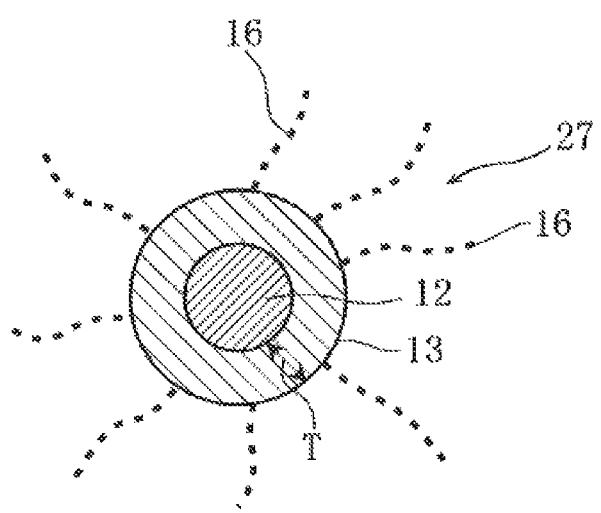
FIG. 9 is a cross-sectional view schematically illustrating a first quantum dot for use in the second embodiment.

That is, in accordance with the second embodiment, the first quantum dot 27 has, as illustrated in FIG. 9 a core-shell structure including a core part 12 and the shell part 13, the surface of the shell part 13 is coated only with the second surfactant 16 that has an electron-transport property, and the thickness T of the shell part 13 is 3 to 5 ML on the basis of the constituent molecule of the shell part 13.

On the other hand, the second quantum dot 10 has, as in the first embodiment (see FIG. 3), the shell part 18 formed on the surface of the core part 17, the surface of the shell part 18 is coated with first and second surfactants 15, 16, and the thickness T' of the shell part 18 is less than 3 ML on the basis of the constituent molecule of the shell part 18.

Then, the first light-emitting layer 25 is disposed closer to an electron transport layer 6, and the second light-emitting layer 26 is disposed closer to a hole transport layer.

In the EL element formed in such a manner, when a voltage is applied between an anode 2 and a cathode 7, the electrons injected into the cathode 7 are injected quickly and efficiently into the first and second quantum dots 27, 10 through a macro-hetero network of the second surfactant 16 that has an electron transport property, and retained in a large amount from the vicinity of the interface between the second quantum dots 10 and the first quantum dots 27 into the second quantum dots 10.

On the other hand, the holes injected into the anode 2 are passed through the thin shell parts 18 of less than 3 ML in thickness T' by the first surfactant 15 that has a hole transport property, and injected into the core parts 17 of the second quantum dots 10. Then, since the second surfactant 16 given to the first quantum dots 27 has no hole transport property, the holes are accumulated near the interface between the second quantum dots 10 and the first quantum dots 27, thereby resulting in the recombination of electrons and holes with high efficiency, and producing exciton luminescence.

In such a manner, also in accordance with the present second embodiment, both a favorable carrier injection efficiency and a hole block function can be achieved, and thus a high-efficiency EL element can be obtained which has a low drive voltage, and has excellent emission characteristics such as luminance characteristics, luminescent efficiency, and purity of luminescent color.

Then, the present second embodiment can be manufactured as follows.

First, first and second raw material solutions are prepared in accordance with the same method and procedure as in the first embodiment.

Next, the first raw material solution is dispersed in a non-polar solvent while the first surfactant 15 that has a hole transport property is added to the solution, thereby preparing a first dispersing solution.

Next, the second raw material solution is dispersed in a polar solvent while the second surfactant 16 that has an electron transport property is added to the solution, thereby preparing a third dispersing solution.

FIGS. 10(a) to 10(c) and 11(d) to 11(f) are manufacturing process diagrams illustrating an example of a method for manufacturing the EL element mentioned above.

Figure 10A:
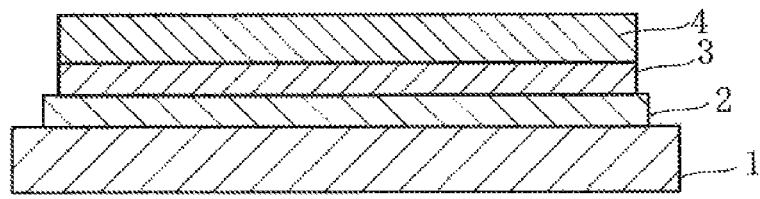
FIGS. 10(a) to 10(c) are manufacturing process diagrams (1/2) illustrating a method for manufacturing the light-emitting device (second embodiment).

First, in accordance with the same method and procedure as in the first embodiment, an anode 2, a hole injection layer 3, and the hole transport layer 4 are formed sequentially on a transparent substrate 1, as illustrated in FIG. 10(a).

Figure 10B:
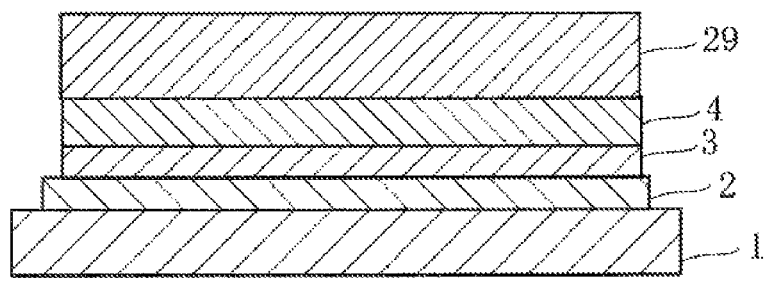

Then, a spin coating method or the like is used to apply the first dispersing solution onto the hole transport layer 4, and the solution is subjected to drying under a $N_2$ atmosphere to form a hole-transporting quantum dot layer 29 as illustrated in FIG. 10(b).

Figure 10C:
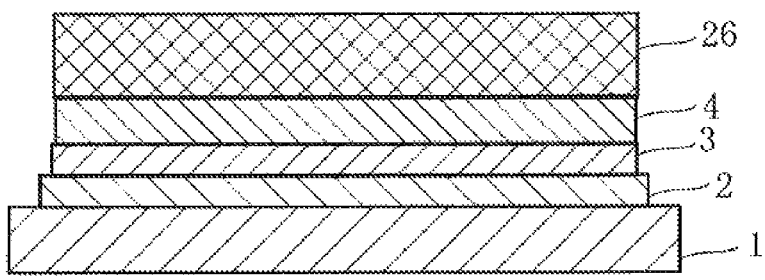

Then, the substrate 1 is immersed in a substitution solution containing the second surfactant 16 that has an electron transport property, thereby forming the second light-emitting layer 26 with more than one layer of second quantum dots 10 stacked and aligned laterally as illustrated in FIG. 10(c).

Figure 11D:
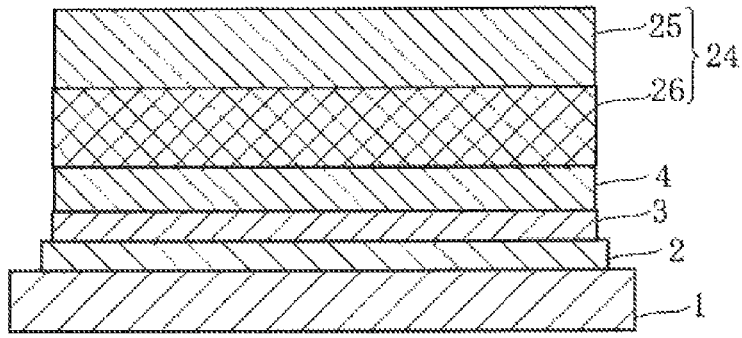
FIGS. 11(d) to 11(f) are manufacturing process diagrams (2/2) illustrating the method for manufacturing the light-emitting device (second embodiment).

Then, a spin coating method or the like is used to apply the third dispersing solution onto the second light-emitting layer 26, and the solution is subjected to drying in a $N_2$ atmosphere to form the first light-emitting layer 25 with more than one layer of first quantum dots 27 stacked and aligned laterally as illustrated in FIG. 11(d).

Thus, the first light-emitting layer 25 and the second light-emitting layer 26 form the light-emitting layer 24.

Figure 11E:
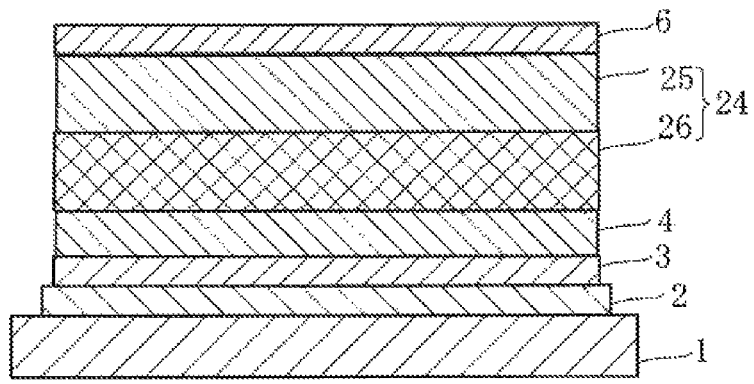
Figure 11F:
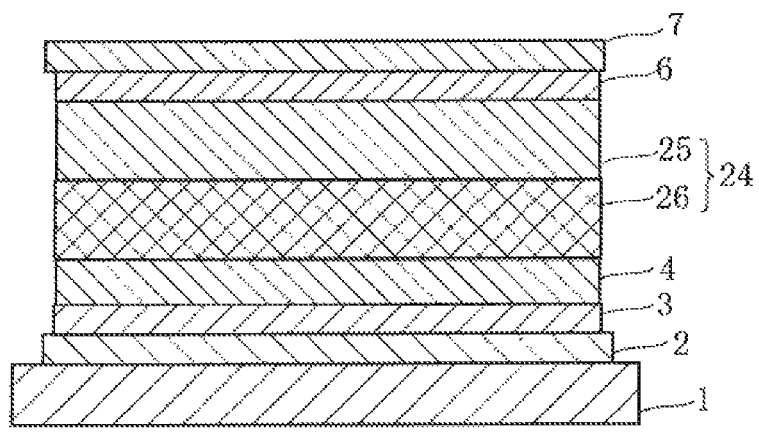

Thereafter, in accordance with the same method and procedure as in the first embodiment, the electron transport layer 6 is formed as illustrated in FIG. 11(e), and a cathode 7 is further formed as illustrated in FIG. 11(f), thereby making it possible to prepare the EL element.

Third Embodiment

Figure 12:
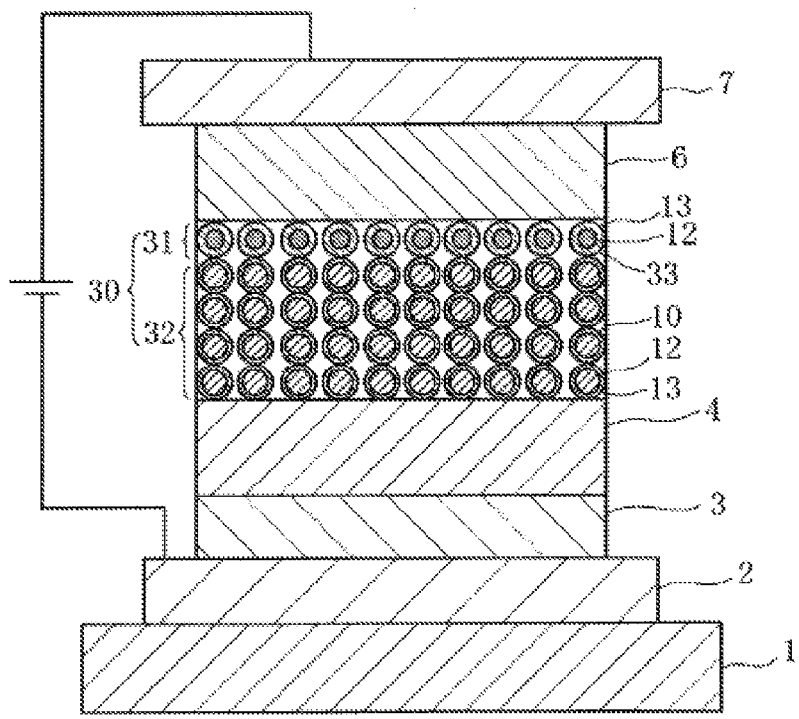
FIG. 12 is a cross-sectional view schematically illustrating a third embodiment of a light-emitting device according to the present invention.

FIG. 12 is a cross-sectional view schematically illustrating a third embodiment of an EL element as a light-emitting device according to the present invention.

This EL element has a light-emitting layer 30 that has a stacked structure of a first light-emitting layer 31 composed of first quantum dots 33 and a second light-emitting layer 32 composed of second quantum dots 10. Then, the second quantum dots 10 have shell parts coated with respective hole-transporting and electron-transporting surfactants, and on the other hand, the first quantum dots 33 are coated with an insulating surfactant.

Figure 13:
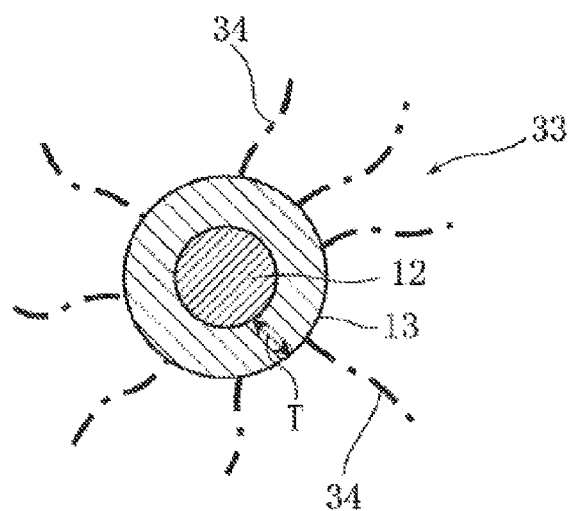
FIG. 13 is a cross-sectional view schematically illustrating a first quantum dot for use in the third embodiment.

That is, according to the third embodiment, the first quantum dot 33 has, as illustrated in FIG. 13, a core-shell structure including a core part 12 and a shell part 13, the surface of the shell part 13 is coated with the third surfactant 34 that has an insulating property, and the thickness T of the shell part 13 is 3 to 5 ML on the basis of the constituent molecule of the shell part 13.

Here, while the third surfactant 34 is not particularly limited as long as the surfactant has an insulating property, but organic compounds having a bulky polar group, for example, surfactants with a polar group bonded to alkyl groups of long-chain amines such as hexadecylamine (hereinafter, referred to as "HDA") and octadecylamine, trioctylphosphine, trioctylphosphine oxide, an oleic acid, and a myristic acid can be used from the perspective of dispersibility and efficient inactivation of surface defects of the first quantum dot 33, and the polar group is coordinated as a ligand on the surface of the shell part 13.

It is to be noted that as for the second quantum dots 10, as in the case of the first and second embodiments (see FIG. 3), a shell part 18 is formed on the surface of a core part 17, the surface of the shell part 18 is coated with first and second surfactants 15, 16, and the thickness T' of the shell part 18 is less than 3 ML on the basis of the constituent molecule of the shell part 18.

In addition, in the present third embodiment, the thickness of the first light-emitting layer 31 is not particularly limited, but is preferably 0.5 to 2 ML on the basis of the particle size of the first quantum dot in consideration of carrier transport properties.

Here, the ML on the basis of the particle size refers to the number of layers in the case of converting the particle of the quantum dot to an equivalent film thickness, and for example, when particles are present at only about half a density in a plane, the ML corresponds to 0.5 ML, and when two particles are present on average, the ML corresponds to 2 ML.

The third surfactant 34 has no electron transport property nor hole transport property, and has an insulating property, and thus is poor in carrier transport properties. For this reason, when the first quantum dots 33 are multi-layered to exceed 2 ML, there is a possibility of causing a decrease in the carrier transport properties.

Therefore, the thickness of the first quantum dot 33 is preferably 2 ML or less on the particle size of the first quantum dot.

However, when the first light-emitting layer 31 has a thickness of less than 0.5 ML, the thickness of the first light-emitting layer 31 excessively reduces to make it difficult to form the shell parts 13 so as to have an adequate thickness and make it difficult to ensure a sufficient hole block function.

In the EL element formed in such a manner, when a voltage is applied between an anode 2 and a cathode 7, since the third surfactant 34 given to the first quantum dots 33 has an insulating property, the electrons injected into the cathode 7 are localized and retained near the interface of the first quantum dots 33 in the second quantum dots 10. On the other hand, the holes injected into the anode 2 pass through the thin shell parts 18 of less than 3 ML in thickness T' by the first surfactant 15 that has hole transport property, and injected into the core parts 17 of the second quantum dots 10. Then, since the third surfactant 34 given to the first quantum dots 33 has an insulating property, the holes are accumulated and retained near the interface with the first quantum dots 33 in the second quantum dots 10. In such a manner, carriers are concentrated and localized near the interface of the first quantum dots 33 in the second quantum dots 10, thereby resulting in the recombination of electrons and holes with high efficiency, and producing exciton luminescence.

In such a manner, also in accordance with the present third embodiment, both a favorable carrier injection efficiency and a hole block function can be achieved, and thus a high-efficiency EL element can be obtained which has a low drive voltage, and has excellent emission characteristics such as luminance characteristics, luminescent efficiency, and purity of luminescent color.

Then, the present third embodiment can be manufactured as follows.

First, first and second raw material solutions are prepared in accordance with the same method and procedure as in the first embodiment.

Next, the first raw material solution is dispersed in a non-polar solvent while the first surfactant 15 that has a hole transport property is added to the solution, thereby preparing a first dispersing solution.

In addition, the second raw material solution is dispersed in a non-polar solvent while the third surfactant 34 that has an insulating property is added to the solution, thereby preparing a fourth dispersing solution.

Figure 14A:
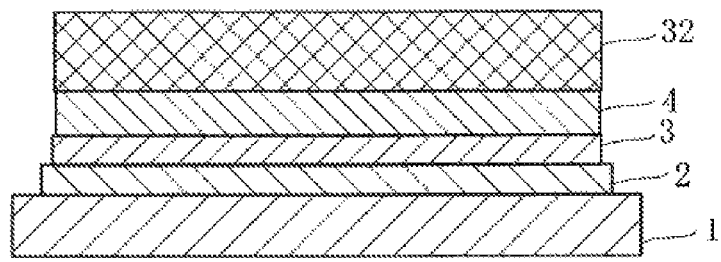
FIGS. 14(a) to 14(c) are manufacturing process diagrams illustrating a method for manufacturing the light-emitting device (third embodiment).
Figure 14B:
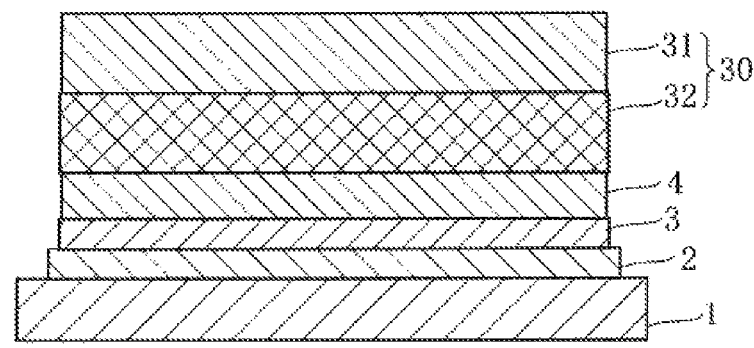
Figure 14C:
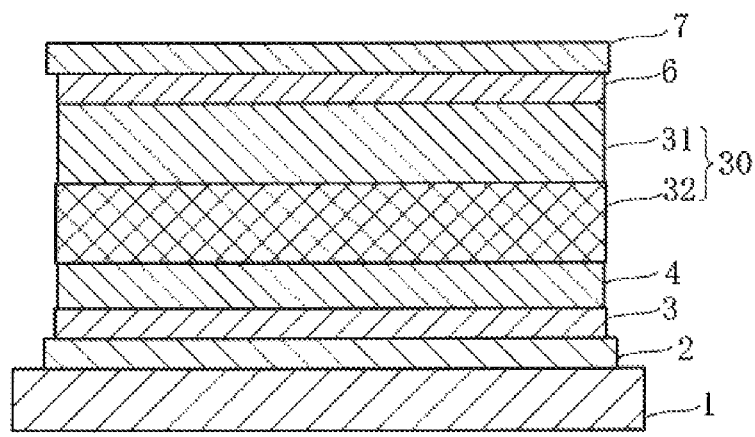

FIGS. 14(a) to 14(c) are main manufacturing process diagrams illustrating an example of a method for manufacturing the EL element mentioned above.

First, in accordance with the same method and procedure as in the first embodiment, the anode 2, a hole injection layer 3, and a hole transport layer 4 are sequentially formed on a transparent substrate 1 as illustrated in FIG. 14(a), a hole-transporting quantum dot layer is further formed with the use of the first dispersing solution mentioned above, and thereafter the substrate 1 is immersed in a substitution solution containing the second surfactant 16 that has an electron transport property, thereby forming the second light-emitting layer 32 with more than one layer of second quantum dots 10 stacked and aligned laterally.

Then, a spin coating method or the like is used to apply a fifth dispersing solution onto the second light-emitting layer 32, and the solution is subjected to drying in a N$_2$ atmosphere, thereby forming the first light-emitting layer 31 such that the thickness of the first light-emitting layer 31 is preferably 0.5 to 2 ML on the basis of the first quantum dot.

Thus, the light-emitting layer 30 is formed which is composed of the first light-emitting layer 31 and the second light-emitting layer 32.

Thereafter, in accordance with the same method and procedure as in the first embodiment, an electron transport layer 6 and the cathode 7 are sequentially formed as illustrated in FIG. 14(c), thereby preparing an EL element.

It is to be noted that the present invention is not limited to the embodiments mentioned above, and various modifications can be made. For example, while the second quantum dots have the shell parts 18 coated with the first and second surfactants 15, 16 that have carrier transport properties in the first embodiment, the second quantum dots 10 may be coated with an insulating surfactant that has no carrier transport property because the first quantum dots 8 have the surfactants 15, 16 that have carrier transport properties, and the second quantum dots 10 have the thin shell parts 18.

In addition, as for the methods for giving the quantum dots carrier transport properties, the embodiments are described above by way of example, and the methods are not limited to the embodiments described above.

In addition, while the compound semiconductors of InP/ZnS are used as the first and second quantum dots in the embodiments described above, other compound semiconductor such as CdSe may be used for the core parts as in [Example 1] described below, and it is obvious that oxides or single semiconductors may be used for the core parts.

In addition, while the EL elements where the hole transport layers 4 and electron transport layers 6 adjacent to the light-emitting layers are formed from organic compounds have been described in the embodiments described above, the same applies to a case where the layers are formed from inorganic compounds, and the leakage of carriers to the adjacent layers can be suppressed, and high-quality light-emitting devices with a favorable recombination probability in the first quantum dots 5 or the first and second quantum dots can be manufactured inexpensively and with high efficiency. In addition, it is obvious that the present invention can be used for, besides EL elements, various types of light-emitting devices such as light-emitting diodes, semiconductor lasers, and various types of display devices.

In addition, the electron transport layer 6 is made by the dry process with the use of the vacuum deposition method in the embodiments mentioned above, but may be prepared by a wet process such as a spin coating method. However, in this case, there is a need to use a dispersing solvent with the same polarity as that of the dispersing solution used in the immersion step.

Next, Examples of the present invention will be described specifically.

EXAMPLE 1

In Example 1, shell parts were coated with HDA that is an insulating surfactant, thereby examining the influence of the shell part thickness on various types of characteristics.

[Preparation of Sample]
(Sample Number 1)
(Preparation of Quantum Dot Dispersing Solution)

A quantum dot dispersing solution with a core part composed of CdSe (LUMO level: 4.4 eV, HOMO level: 6.5 eV) and a shell part composed of ZnS (LUMO level: 3.9 eV, HOMO level: 7.4 eV) was prepared.

That is, a cadmium oxide and a stearic acid were weighed to provide the cadmium oxide: 1.6 mmol and the stearic acid: 6.4 mmol. Then, the cadmium oxide and the stearic acid were put into a round-bottom flask with octadecene: 16 mL retained therein, and mixed in the octadecene. Then, this mixture was stirred with a stirring bar for 30 minutes while being heated to 100° C. under reduced pressure, further stirred with a stirring bar for 1 hour while being heated to 200° C. under a nitrogen atmosphere, and cooled to room temperature. Thereafter, to this solution, TOPO: 4 g and octadecylamine: 12 g were added, and the solution was again stirred with a stirring bar for 30 minutes while being heated to 100° C. under reduced pressure, thereby preparing a Cd-containing precursor solution.

Next, Se and TBP were weighed to provide Se: 16 mmol and TBP: 18.1 mmol, mixed in octadecene: 13.89 mL, and heated to 100° C., thereby preparing a Se-containing precursor solution.

Next, the Cd-containing precursor solution was heated to 280° C. in a nitrogen atmosphere, and the temperature was caused to naturally decrease to 250° C. or less while the total amount (about 18.6 mL) of the Se-containing precursor solution at ordinary temperature was injected through a syringe to form nuclei of CdSe. Thereafter, the temperature was caused to increase to 250° C., and further while the temperature of 250° C. was kept, a stirring bar was used for stirring for 90 minutes to grow nanocrystals (quantum dots), thereby preparing a CdSe quantum dot solution.

Next, octadecylamine: 3 mL and octadecene: 9 mL were put into another round-bottom flask, heated at a temperature of 100° C. for 60 minutes under reduced pressure, stirred, and thereafter returned to ordinary temperature. Then, 4.5 mL of the CdSe quantum dot solution was separated and injected thereto, and stirred at a temperature of 100° C. for 30 minutes under reduced pressure. Thus, the octadecylamine was coordinated on the quantum dot surfaces to inactivate surface defects, thereby preparing a CdSe quantum dot dispersing solution with dispersibility increased.

Next, sulfur: 13 mmol was sufficiently mixed with octadecene: 10 mL to prepare a sulfur precursor solution, and 1 mmol of zinc oxide, oleic acid: 4 mmol, and octadecene: 10 mL were sufficiently mixed to prepare a zinc oxide precursor solution.

Then, the CdSe quantum dot solution was heated to 240° C., the sulfur precursor solution: 1.5 mL was injected, then after 20 minutes, the zinc oxide precursor solution: 1.5 mL was injected, and thereafter, the solutions were heated and stirred for 60 minutes, thereby forming shell parts composed of ZnS on the surfaces of the core parts composed of CdSe. Thereafter, treatment with acetone was carried out, and the operation for centrifugation was further carried out to remove impurities in the solution.

Thereafter, the solution was dispersed in toluene while HDA was added to the solution, thereby preparing a quantum dot dispersing solution composed of CdSe/ZnS with a surface coated with HDA at a concentration of 1 mg/mL.

(Preparation of Device Sample)

A glass substrate of 25 mm×25 mm was prepared, and on the glass substrate, an ITO film (work function: 4.8 eV) was deposited by a sputtering method, and subjected to UV-ozone treatment to prepare an anode of 120 nm in film thickness.

Next, PEDOT:PSS (LUMO level: 3.1 eV, HOMO level: 5.1 eV) was applied onto the anode with the use of a spin coating method, and subjected to drying to form a hole injection layer of 20 nm in film thickness.

Next, poly-TPD (LUMO level: 2.3 eV, HOMO level: 5.4 eV) was applied onto the hole injection layer with the use of a spin coating method, and subjected to drying to form a hole transport layer of 65 nm in film thickness.

Then, a spin coating method was used to apply the quantum dot dispersing solution onto the hole transport layer to form a light-emitting layer. Specifically, 0.1 mL of the quantum dot dispersing solution was dropped onto the hole transport layer, rotated at rotation frequency: 3000 rpm for 60 seconds, and subjected to drying by heating to 100° C. in a nitrogen atmosphere, thereby preparing the light-emitting layer.

Next, Alq3 (LUMO level: 3.1 eV, HOMO level: 5.8 eV) was deposited on the surface of the light-emitting layer with the use of a vapor deposition method to form an electron transport layer of 50 nm in film thickness.

Then, finally, LiF/Al (work function: 4.3 eV) was deposited with the use of a vapor deposition method to form a cathode of 100 nm in film thickness, thereby preparing a sample of sample number 1.

It is to be noted that as for the sample of sample number 1, according to the observation of a cross section with a TEM, the thickness of the shell part was 3 ML on the basis of the constituent molecule of the shell part, and thickness of the light-emitting layer was 1 ML on the basis of the particle size of the quantum dot.

(Sample Number 2)

In accordance with the same method and procedure as for sample number 1 except that the addition amounts of the sulfur precursor solution and zinc oxide precursor solution to the CdSe quantum dot solution were reduced to ⅓, a quantum dot dispersing solution was prepared.

Thereafter, a sample of sample number 2 was prepared in accordance with the same method and procedure as for sample number 1.

It is to be noted that as for the sample of sample number 2, according to the observation of a cross section with a TEM, the thickness of the shell part was 1 ML on the basis of the constituent molecule of the shell part, and thickness of the light-emitting layer was 1 ML on the basis of the particle size of the quantum dot.

(Sample Number 3)

In accordance with the same method and procedure as for sample number 1, a CdSe quantum dot solution was prepared.

Then, the CdSe quantum dot solution was dispersed in toluene while HDA was added to the solution, thereby preparing a quantum dot dispersing solution composed of CdSe with a surface coated with HDA at a concentration of 1 mg/mL.

Thereafter, a sample of sample number 3 was prepared in the same method and procedure as for sample number 1.

It is to be noted that as for sample number 3, according to the observation of a cross section with a TEM, there was no shell part, and thickness of the light-emitting layer was 1 ML on the basis of the particle size of the quantum dot.

(Evaluation of Sample)

Figure 15:
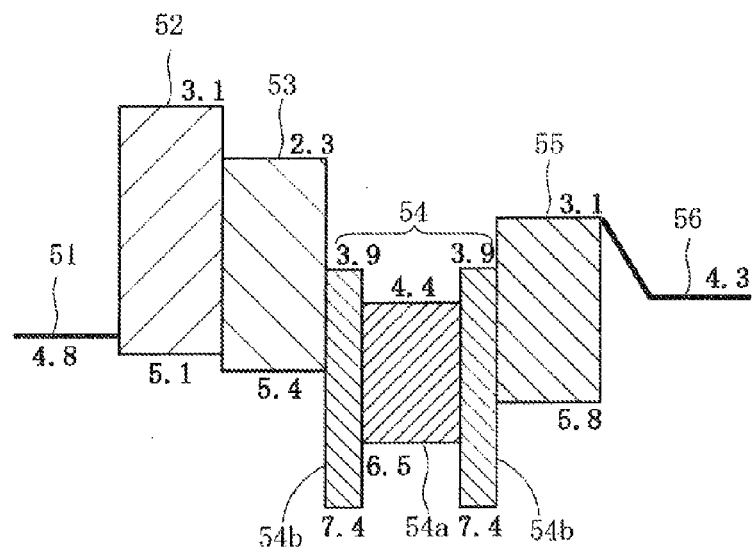
FIG. 15 is a band structure diagram illustrating an energy band for sample numbers 1 and 2 according to Example 1.

FIG. 15 is a band structure diagram illustrating an energy band for sample numbers 1 and 2, and an anode 51, a hole injection layer 52, a hole transport layer 53, a light-emitting layer composed of a quantum dot 54 including a core part 54a and a shell part 54b, an electron transport layer 55, and a cathode 56 are sequentially stacked, and the respective layers have the energy levels illustrated in the figure.

In addition, sample number 3 has the same band structure as in FIGS. 11(d) to 11(f), except for including no shell part 54b.

For each sample of sample numbers 1 to 3, the current density, luminance characteristics, luminescent efficiency, and emission spectrum were measured to evaluate the samples.

First, for each sample, with the use of a multichannel detector (PMA-11 from Hamamatsu Photonics K.K.), direct-current voltage was applied in steps to measure the current density and the luminance at each voltage.

In addition, each external quantum efficiency $\eta$ext at the current density obtained as described above was calculated on the basis of formula (1), thereby evaluating the luminescent efficiency.

$$\eta\text{ext} = \gamma \cdot \eta\text{int} \cdot \eta\text{out} \qquad (1)$$

In this formula, $\eta$int represents an internal quantum efficiency, and represents the proportion of recombination of an electron and a hole in a quantum dot, that is, the proportion of photons that contribute to exciton luminescence. $\gamma$ represents a carrier balance factor between a hole and an electron, and $\eta$out represents a light extraction efficiency $\eta$out for light extracted externally.

The external quantum efficiency $\eta$ext is the external quantum efficiency obtained by multiplying the internal quantum efficiency $\eta$int by the carrier balance factor and the light extraction efficiency $\eta$out, and means that when the external quantum efficiency $\eta$ext is large, the luminescent efficiency improves.

It is to be noted that this internal quantum efficiency $\eta$int is calculated from the number of injected electrons which is calculated from the current density, and the number of luminescent photons by measuring the number of luminescent photons.

In addition, the emission spectrum was measured by the following method.

That is, each sample was placed in an integrating sphere, a direct-current voltage was applied to cause the sample to emit light at a luminance of 100 cd/m$^2$ with the use of a constant-current power source (2400 from Keithley Instruments Inc.), the emitted light is collected by the integrating sphere, and an emission spectrum was measured with the multichannel detector mentioned above.

Figure 16:
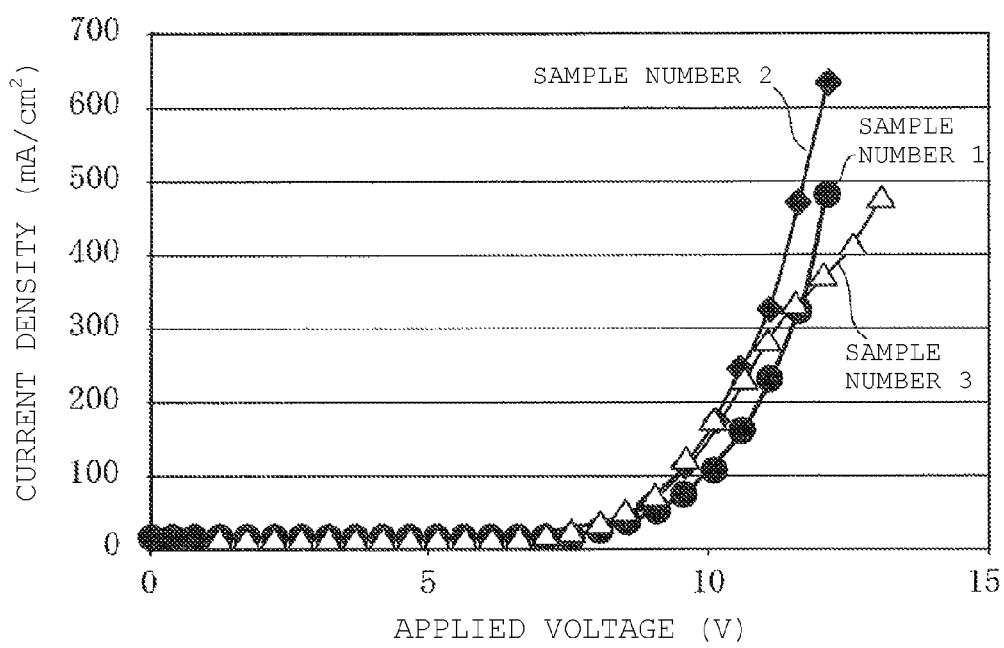
FIG. 16 is a diagram illustrating current density characteristics according to Example 1.

FIG. 16 is a diagram illustrating the relationship between the applied voltage and the current density, where the horizontal axis indicates the applied voltage (V), and the vertical axis indicates the current density (mA/cm$^2$).

Figure 17:
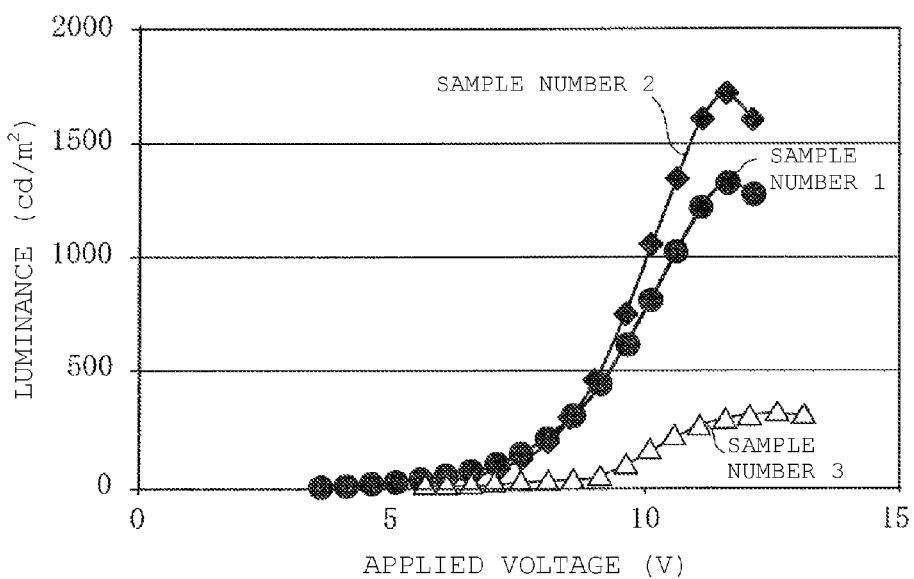
FIG. 17 is a diagram illustrating luminance characteristics according to Example 1.

FIG. 17 is a diagram illustrating luminance characteristics, where the horizontal axis indicates the applied voltage (V), and the vertical axis indicates the luminance (cd/m$^2$).

Figure 18:
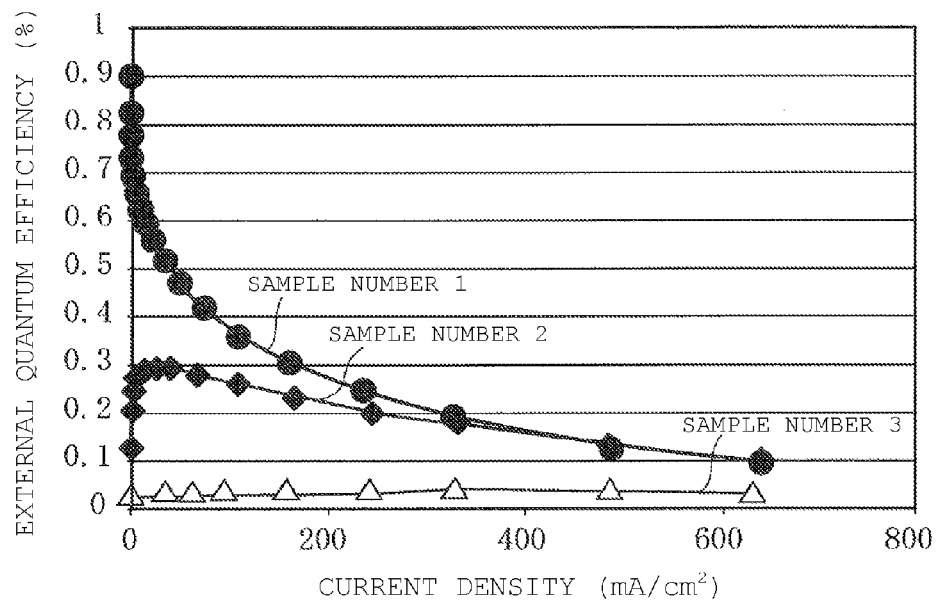
FIG. 18 is a diagram illustrating luminescent efficiency characteristics according to Example 1.

FIG. 18 is a diagram illustrating characteristics for luminescent efficiency, where the horizontal axis indicates the current density (mA/cm$^2$), and the vertical axis indicates the external quantum efficiency (%).

In each of FIGS. 16 to 18, a mark ● refers to sample number 1 (shell part thickness: 3 ML), a mark ◆ refers to sample number 2 (shell part thickness: 1 ML), and a mark Δ refers to sample number 3 (shell part thickness: 0 ML).

Figure 19:
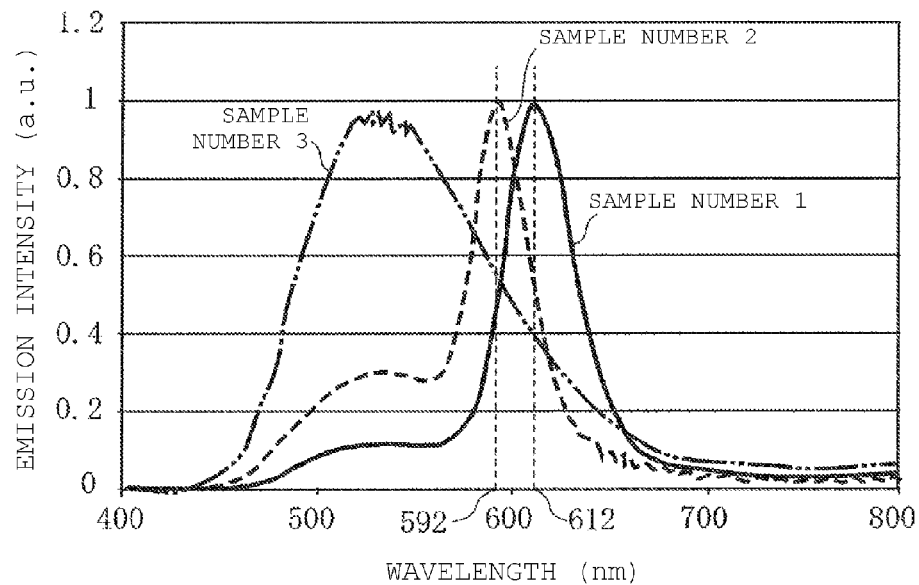
FIG. 19 is a diagram illustrating emission spectra according to Example 1.

FIG. 19 is a diagram illustrating emission spectra, where the horizontal axis indicates the wavelength (nm), and the vertical axis represents the emission intensity (a.u.). In the figure, a solid line refers to sample number 1, a dashed line refers to sample number 2, and a chain double-dashed line refers to sample number 3. It is to be noted that as for the emission intensity, the measurement results are normalized between 0 and 1 and illustrated.

Sample number 3 has quantum dots formed only from core parts, and thus the surfaces of the quantum dots had defects generated significantly, and for this reason, the drive voltage was high (FIG. 16), and the luminance and the luminescent efficiency also became extremely low (FIG. 17, FIG. 18). In addition, it has been found that the emission spectrum also has a peak produced around the absorption wavelength range (535 nm) of Alq3 that is the electron transport layer, and desired emission characteristics cannot be obtained (FIG. 19).

In addition, since sample number 2 has the thin ZnS (shell part) of 1 ML in thickness, sample number 2 enables driving at low voltages (FIG. 16), and also has favorable luminance characteristics (FIG. 17), but had an extremely low luminescent efficiency in a low current-density region (FIG. 18). In addition, it has been found that the emission spectrum has a peak that appears around 592 nm, but luminescence is also produced around 535 nm that is the absorption wavelength range of Alq3, and thus a purity of luminescent color decreases (FIG. 19). This is considered to be because some of holes injected into quantum dots leaked to the outside without being recombined in the quantum dots, thereby also producing luminescence around the absorption wavelength range of the electron transport layer that is an adjacent layer.

In contrast, as for sample number 1, the ZnS film (shell part) has an adequate thickness of 3 ML, and the shell part exhibits a hole block function. Thus, it has been found that as compared with sample number 2, the drive voltage slightly increases (FIG. 16), and the luminance also slightly decreases (FIG. 17), but the recombination probability of holes and electrons in the quantum dots increases, and as a result, the luminescent efficiency improves dramatically (FIG. 18). In addition, since the leakage of holes to the outside is suppressed by the hole block function of the shell part as described above, it has been found that the emission spectrum also has a peak that appears around 612 nm that is the absorption wavelength range of the quantum dots, and luminescence reduces in the absorption wavelength range of the electron transport layer that is an adjacent layer, and a purity of luminescent color also improves (FIG. 19).

In such a manner, it has been found that the increase to 3 ML in thickness of the ZnS film (shell part) of the quantum dot (nanoparticle material) slightly increases the drive voltage, and also slightly decreases the luminance, but dramatically improves the luminescent efficiency, and also improves the purity of luminescent color.

On the other hand, when the ZnS film of the quantum dot is made small in thickness of 1 ML, the injection efficiency of carriers into the quantum dot increases, thus making it possible to decrease the drive voltage, and also making it possible to slightly improve the luminance.

Accordingly, the combination of the both is considered to make it possible to obtain a light-emitting device which is low in drive voltage, high in luminance and luminescent efficiency, and high in purity of luminescent color.

EXAMPLE 2

In Example 2, a light-emitting layer was formed to have a stacked structure of a first light-emitting layer and a second light-emitting layer, and sample number 11 was formed such that the shell thickness of the quantum dot for the first light-emitting layer became 3 ML on the basis of the constituent molecule of the shell part, and the shell thickness of the quantum dot for the second light-emitting layer became 1 ML on the basis of the constituent molecule of the shell part.

In addition, sample number 12 was formed such that the shell thickness of the quantum dot for both the first light-emitting layer and second light-emitting layer became 1 ML on the basis of the constituent molecule of the shell part.

In addition, as for surfactants, both sample numbers 11 and 12 were prepared such that the first quantum dots forming the first light-emitting layer had the second surfactant with an electron transport property, and the second quantum dots forming the second light-emitting layer had the first and second surfactants with a hole transport property and an electron transport property.

Example will be described specifically below.
[Preparation of Sample]
[Sample Number 11]
(Preparation of First and Second Dispersing Solutions)

ZnS was used for the shell material, and InP (LUMO level: 5.8 eV, HOMO level: 4.4 eV) was used for the core material.

That is, indium acetate and myristic acid were weighed to provide combination ratios of indium acetate: 1.6 mmol and myristic acid: 6.16 mmol, and put into a round-bottom flask with octadecene: 16 mL retained therein, and the indium acetate and the myristic acid were mixed in the octadecene, and dissolved while being stirred in a nitrogen atmosphere, thereby preparing an indium-containing precursor solution.

In addition, tristrimethylsilylphosphine and octylamine were weighed to provide combination ratios of tristrimethylsilylphosphine: 0.8 mmol and octylamine: 0.96 mmol, and put into a round-bottom flask with octadecene: 4.16 mL retained therein, and the tristrimethylsilylphosphine and the octylamine were mixed in the octadecene, and dissolved while being stirred in a nitrogen atmosphere, thereby preparing a phosphorus-containing precursor solution.

Then, the indium-containing precursor solution was heated to a temperature of 190° C., and the total amount of the phosphorus-containing precursor solution at ordinary temperature was injected into the heated solution through a syringe, thereby preparing an InP quantum dot solution.

Next, a zinc oxide precursor solution of zinc oxide: 1 mmol dissolved in stearic acid: 10 mL was prepared, and further, a sulfur precursor solution of sulfur: 13 mmol dissolved in stearic acid: 10 mL was prepared.

Then, into the InP quantum dot solution adjusted to a temperature of 150° C., the zinc oxide precursor solution and the sulfur precursor solution were alternately dropped in minute amounts, heated and cooled, and washed to remove excessive organic components in the solutions, thereby preparing raw material solutions. Thereafter, the raw material solutions were dispersed in toluene while a TBD-amine ligand or a TPD-thiol ligand was added to the solutions, thereby preparing first and second dispersing solutions.

Specifically, the dropping amount, dropping frequency, concentration, and the like of the InP quantum dot solution were adjusted to prepare a first raw material solution with ZnS of 3 ML in film thickness and a second raw material solution with ZnS of 1 ML in film thickness. Then, the first raw material solution mentioned above was dispersed in toluene while a TBD-amine ligand was added to the solution, thereby preparing the first dispersing solution, and also the second raw material solution mentioned above was dispersed in toluene while a TPD-thiol ligand was added to the solution, thereby preparing the second dispersing solution.

It is to be noted that the thickness of the ZnS was confirmed by preparing a device sample, and thereafter observing a cross section thereof with a TEM.

(Preparation of Device Sample)

On a glass substrate, an ITO film was deposited by a sputtering method, and subjected to UV-ozone treatment to form an anode of 100 nm in film thickness.

Next, a hole transport layer solution of PEDOT:PSS dissolved in pure water was prepared. Then, a spin coating method was used to apply the hole injection layer solution onto the anode, thereby forming a hole injection layer of 20 nm in film thickness.

Next, the second dispersing solution described above was prepared.

Then, a spin coating method or the like was used to apply the second dispersing solution onto the hole transport layer, and the solution was subjected to drying in a $N_2$ atmosphere to prepare a hole-transporting quantum dot layer.

Then, a substitution solution of a TBD-amine ligand dispersed in methanol was prepared. Then, the glass substrate with the hole-transporting quantum dot layer formed on the surface of the substrate was immersed for 60 minutes in the substitution solution to substitute some of the TPD-thiol ligand with the TBD-amine ligand, thereby forming the second light-emitting layer with the second quantum dots aligned in layers.

Next, the first dispersing solution described above was prepared. Then, this first dispersing solution was applied onto the second light-emitting layer 11, and the solution was subjected to drying in a $N_2$ atmosphere to form the first light-emitting layer composed of the first quantum dots with the shell parts coated with the electron-transporting second surfactant.

Then, with the use of Alq3, an electron transport layer of 50 nm in film thickness was formed by a vacuum deposition method on the surface of the first light-emitting layer.

Then, with the use of Ca/Al, the cathode 8 of 100 nm in film thickness was formed by a vacuum deposition method, thereby preparing a device sample of sample number 11.

(Sample Number 12)

In accordance with the same method and procedure as for sample number 11 except that the second dispersing solution was used in the preparation of the first light-emitting layer, a device sample of sample number 12 was prepared.

[Evaluation of Sample]

Figure 20:
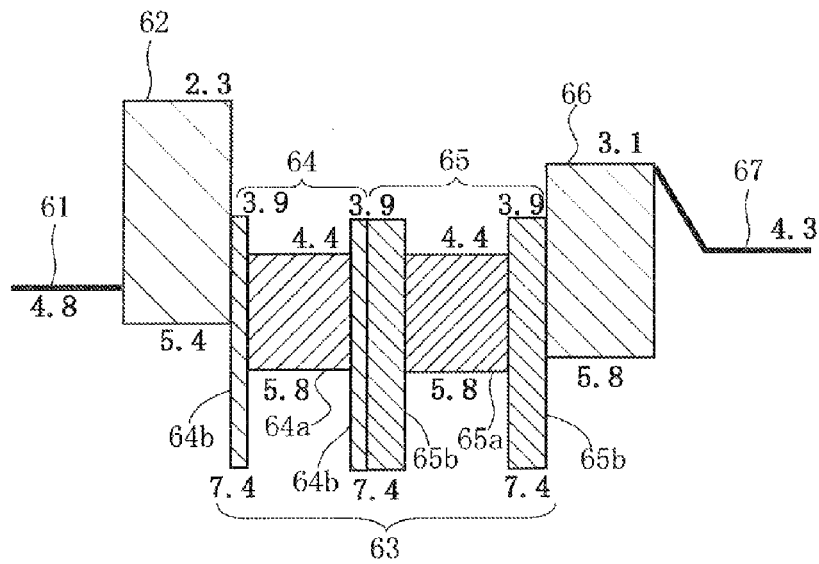
FIG. 20 is a band structure diagram illustrating an energy band for sample number 11 according to Example 2.

FIG. 20 is a band structure diagram of an energy band for sample number 11, and an anode 61, a hole transport layer 62, first and second quantum dots 64, 65 (light-emitting layer 63), an electron transport layer 66, and a cathode 67 are sequentially stacked, and the respective layers have the energy levels illustrated in the figure. In addition, the first and second quantum dots 64, 65 respectively have core parts 64a, 65a and shell parts 64b, 65b.

The band structure of sample number 12 is identical to that in FIG. 20, except that the first quantum dot is identical in shell part thickness to the second quantum dot.

For each sample of sample number 11 and sample number 12, luminance characteristics and luminescent efficiency were evaluated in accordance with the same method and procedure as in Example 1.

Figure 21:
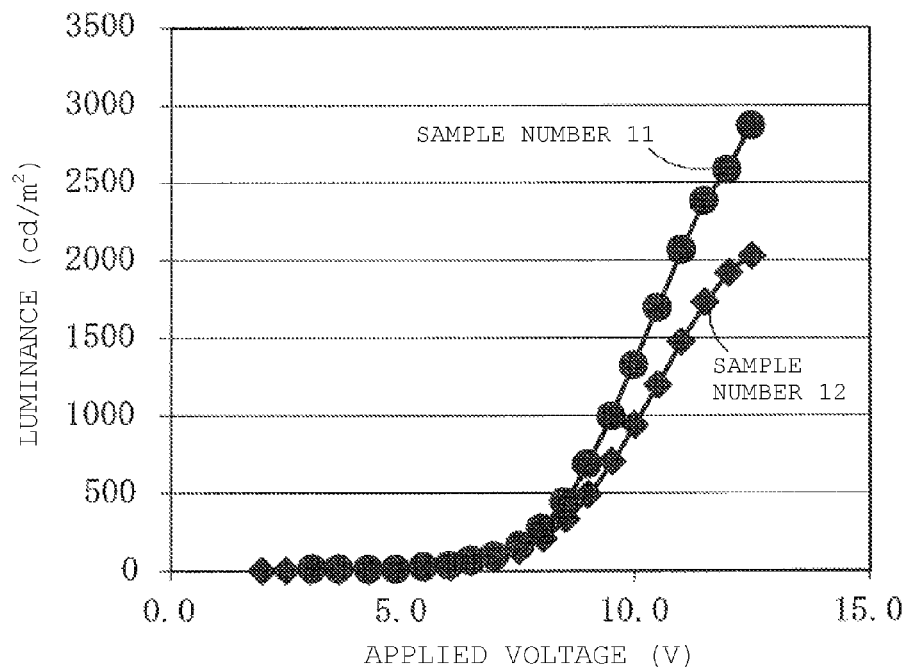
FIG. 21 is a diagram illustrating luminance characteristics according to Example 2.

FIG. 21 is a diagram illustrating luminance characteristics, where the horizontal axis indicates the applied voltage (V), and the vertical axis indicates the luminance (cd/m²).

Figure 22:
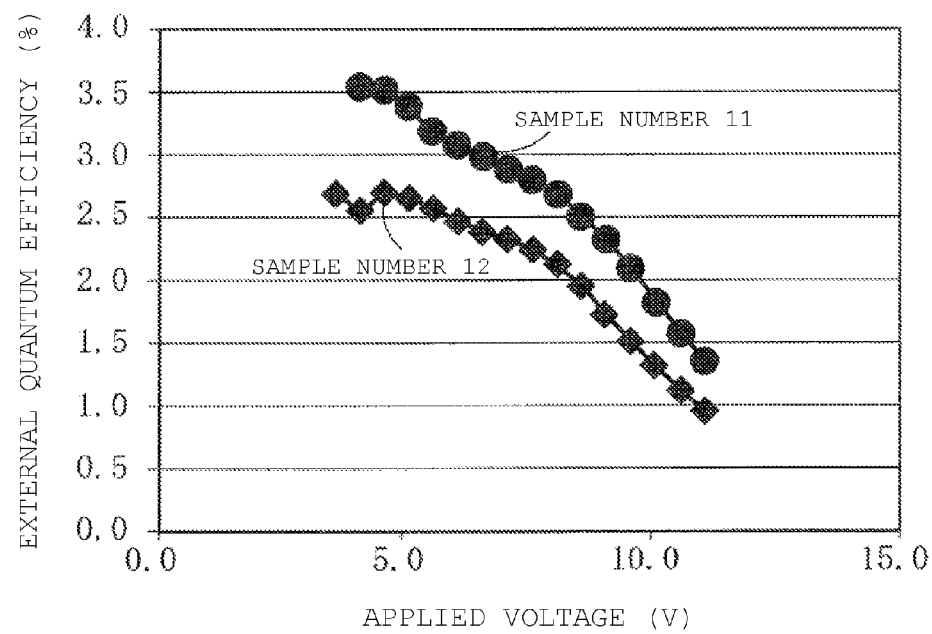
FIG. 22 is a diagram illustrating luminescent efficiency characteristics according to Example 2.

FIG. 22 is a diagram illustrating characteristics for luminescent efficiency, where the horizontal axis indicates the applied voltage (V), and the vertical axis indicates the external quantum efficiency (%).

In each of FIGS. 21 to 22, a mark ● refers to sample number 11, and a mark ♦ refers to sample number 12.

As is clear from FIGS. 21 and 22, sample number 12 was low in luminance, and also low in luminescent efficiency, because the first and second light-emitting layers each have a shell part thickness of 1 ML.

In contrast, it has been found that sample number 1 has an injection efficiency and luminance improved as compared with sample number 11, because the first light-emitting layer closer to the hole transport layer has a shell part thickness of 3 ML, and the second light-emitting layer closer to the electron transport layer has a shell part thickness of 1 ML. In addition, it has been also confirmed that the luminescent efficiency improves because the hole block function improves.

The improved efficiency of injecting carriers into quantum dots (nanoparticle material), and the suppressed leakage of holes injected into the quantum dots to the outside of the quantum dots make it possible to realize light-emitting devices such as EL elements improved in luminescent efficiency and purity of luminescent color.

DESCRIPTION OF REFERENCE SYMBOLS 4 hole transport layer
5 light-emitting layer
6 electron transport layer
8 first quantum dot
9 first light-emitting layer
10 second quantum dot
11 second light-emitting layer
12 core part
13 shell part
15 first surfactant
16 second surfactant
17 core part
18 shell part
24 light-emitting layer
25 first light-emitting layer 26 second light-emitting layer
27 first quantum dot
30 light-emitting layer
31 first light-emitting layer
32 second light-emitting layer
33 first quantum dot
34 third surfactant

The invention claimed is:

1. A light-emitting device comprising:
a hole transport layer;
an electron transport layer; and
a light-emitting layer interposed between the hole transport layer and the electron transport layer, the light-emitting layer emitting light when an electric current is injected into the light-emitting layer,
wherein the light-emitting layer has a stacked structure including:
a first light-emitting layer composed of a first quantum dot having a first core part, and a first shell part coating the first core part, the first shell part having a first surface coated with a first surfactant that has a hole transport property and a second surfactant that has an electron transport property, the first shell part having a thickness of 3 to 5 monolayers based on a constituent molecule of the first shell part; and
a second light-emitting layer composed of a second quantum dot having a second core part, and a second shell part, the second shell part having a thickness of less than 3 monolayers based on a constituent molecule of the second shell part, and the second shell part having a second surface coated with both the first surfactant having a hole transport property and the second surfactant having an electron transport property, and
the first light-emitting layer is disposed proximal to the electron transport layer relative to the second light-emitting layer, and the second light-emitting layer is disposed proximal to the hole transport layer relative to the first light-emitting layer.

2. The light-emitting device according to claim 1, wherein the first light-emitting layer has a thickness of 0.5 to 2 monolayers based on a particle size of the first quantum dot.

3. The light-emitting device according to claim 1, wherein each of the first and second shell parts has an energy level of a valence band based on a vacuum level that is lower than an energy level of a valence band of the electron transport layer or an HOMO level of the electron transport layer.

4. The light-emitting device according to claim 1, wherein the second surfactant has a conduction band that achieves a tunneling resonance with a conduction band of the first core part and an excitation level of the valence band of the first core part.

* * * * *